(12) United States Patent
Yassour et al.

(10) Patent No.: US 7,604,439 B2
(45) Date of Patent: Oct. 20, 2009

(54) NON-CONTACT SUPPORT PLATFORMS FOR DISTANCE ADJUSTMENT

(75) Inventors: Yuval Yassour, Hasolelim (IL); Arie Harnik, Haifa (IL); Hilel Richman, Haifa (IL)

(73) Assignee: Coreflow Scientific Solutions Ltd., Yokneam (IL)

( * ) Notice: Subject to any disclaimer, the term of this patent is extended or adjusted under 35 U.S.C. 154(b) by 203 days.

(21) Appl. No.: 11/578,162

(22) PCT Filed: Apr. 13, 2005

(86) PCT No.: PCT/IL2005/000390

§ 371 (c)(1),
(2), (4) Date: Oct. 11, 2006

(87) PCT Pub. No.: WO2005/099350

PCT Pub. Date: Oct. 27, 2005

(65) Prior Publication Data

US 2007/0195653 A1    Aug. 23, 2007

Related U.S. Application Data

(60) Provisional application No. 60/561,904, filed on Apr. 14, 2004.

(51) Int. Cl.
*B65G 53/00*    (2006.01)
(52) U.S. Cl. .............................. 406/88; 406/86; 414/676
(58) Field of Classification Search .................. 406/88; 414/676
See application file for complete search history.

(56) References Cited

U.S. PATENT DOCUMENTS 2,938,590 A * 5/1960 Barnett ....................... 180/125

(Continued)

FOREIGN PATENT DOCUMENTS

WO    WO 01/19572    3/2001
WO    WO 03/060961    7/2003

OTHER PUBLICATIONS

International Search Report for International Application No. PCT/IL05/00390 mailed Mar. 1, 2007.

*Primary Examiner*—Gene Crawford
*Assistant Examiner*—William R Harp
(74) *Attorney, Agent, or Firm*—Pearl Cohen Zedek Latzer, LLP

(57) ABSTRACT

An apparatus for supporting a stationary or moving substantially flat object without physical contact on an fluid-cushion. The object floats on a fluid cushion gap, the apparatus aimed for globally or locally adjusting the gap. The apparatus comprising: a first platform for supporting the object without contact, the platform having a substantially flat active surface comprised of one or more sectors, each sector comprising at least one of a plurality of basic cells, each basic cell having at least one of a plurality of pressure outlets fluidically connected through a pressure flow restrictors to a higher-pressure manifold associated with the sector in which the basic cell lies, the higher-pressure manifold is fluidically connected through main supply pipeline to pressurized fluid supply and at least one of a plurality of fluid-evacuation channels fluidically connected to a lower-pressure manifold associated with the sector in which the basic cell lies having main evacuation pipeline; wherein the flow restrictor characteristically exhibiting fluidic return spring behavior; and wherein at least one pressure control valve is interposed with at least one of the two main pipelines of at least one sector for controlling pressure levels of at least one of the two manifolds of that sector.

1 Claim, 19 Drawing Sheets

U.S. PATENT DOCUMENTS

| | | | | |
|---|---|---|---|---|
| 3,209,623 A * | 10/1965 | Schardt | | 269/69 |
| 3,253,665 A * | 5/1966 | Schienle | | 180/164 |
| 3,395,943 A * | 8/1968 | Wilde et al. | | 406/88 |
| 3,417,878 A | 12/1968 | Schonfelder et al. | | |
| 3,449,102 A * | 6/1969 | Chaumont et al. | | 65/25.2 |
| 3,455,669 A * | 7/1969 | McMaster et al. | | 65/182.2 |
| 3,455,670 A * | 7/1969 | McMaster | | 65/182.2 |
| 3,455,671 A * | 7/1969 | McMaster | | 65/182.2 |
| 3,473,910 A * | 10/1969 | Wilde et al. | | 65/182.2 |
| 3,628,673 A * | 12/1971 | Lynn, Jr. | | 414/676 |
| 3,827,364 A * | 8/1974 | Maison | | 104/23.2 |
| 4,014,576 A | 3/1977 | Druschel et al. | | |
| 4,015,880 A * | 4/1977 | Colvin et al. | | 406/88 |
| 4,081,201 A * | 3/1978 | Hassan et al. | | 406/88 |
| 4,165,132 A * | 8/1979 | Hassan et al. | | 406/10 |
| 4,275,983 A * | 6/1981 | Bergman | | 414/676 |
| 4,298,307 A * | 11/1981 | Bergman | | 414/676 |
| 4,326,831 A * | 4/1982 | Bergman | | 414/676 |
| 4,354,796 A * | 10/1982 | Bergman | | 414/676 |
| 4,444,541 A * | 4/1984 | Bergman | | 414/676 |
| 4,874,273 A * | 10/1989 | Tokisue et al. | | 406/88 |
| 5,102,118 A * | 4/1992 | Vits | | 271/195 |
| 5,209,387 A * | 5/1993 | Long et al. | | 226/97.3 |
| 5,634,636 A * | 6/1997 | Jackson et al. | | 271/225 |
| 5,797,327 A * | 8/1998 | Gieser et al. | | 101/483 |
| 5,803,979 A | 9/1998 | Hine et al. | | |
| 6,676,365 B2 * | 1/2004 | Adam et al. | | 406/83 |
| 6,781,684 B1 * | 8/2004 | Ekhoff | | 356/237.1 |
| 6,810,297 B2 * | 10/2004 | Adin et al. | | 700/110 |
| 6,969,224 B2 | 11/2005 | Miyachi et al. | | |
| 7,107,792 B2 * | 9/2006 | Langsdorf et al. | | 65/25.2 |
| 7,108,123 B2 * | 9/2006 | Zeidler et al. | | 198/493 |
| 7,128,516 B2 * | 10/2006 | Sugiyama et al. | | 414/676 |
| 2002/0182047 A1 * | 12/2002 | Adam et al. | | 414/676 |
| 2003/0169524 A1 * | 9/2003 | Adin et al. | | 359/896 |
| 2005/0015170 A1 * | 1/2005 | Adin et al. | | 700/110 |
| 2006/0180140 A1 * | 8/2006 | Lisec | | 126/39 R |

* cited by examiner

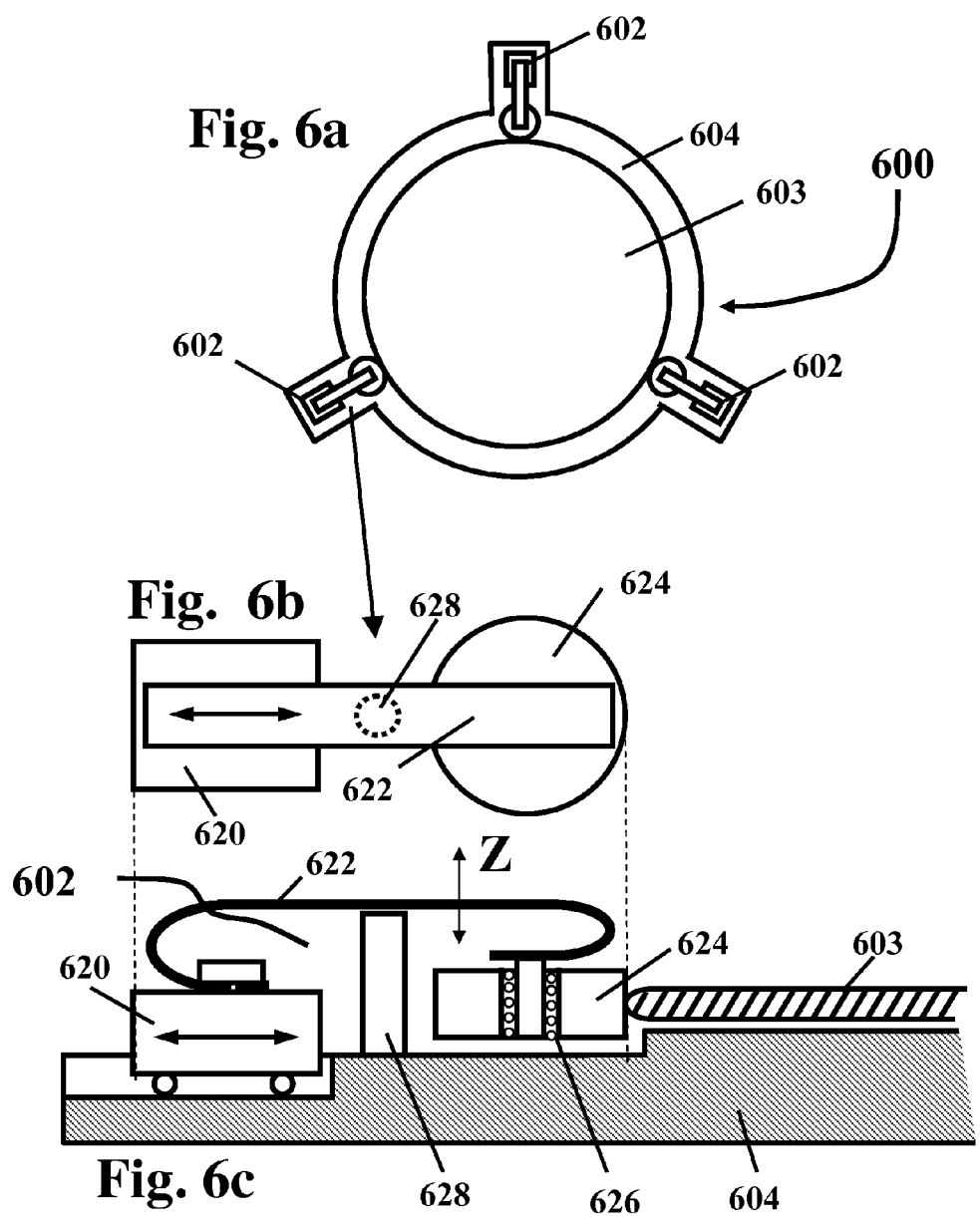

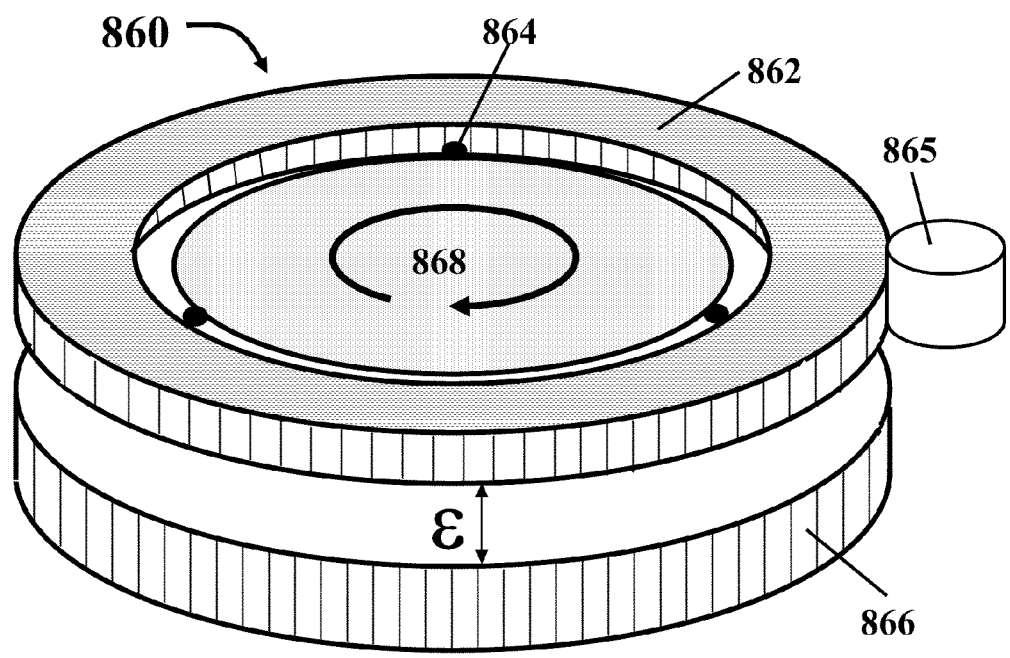
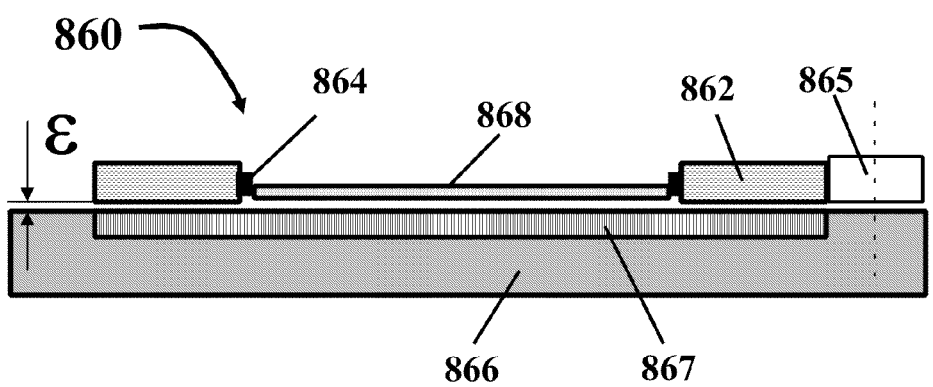
Fig. 8d

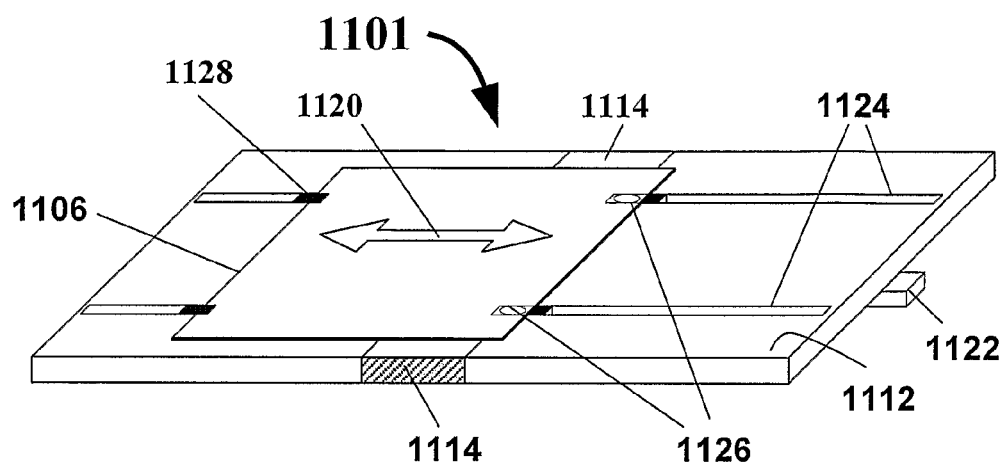
Fig. 11a
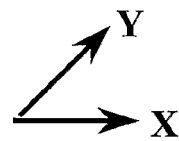
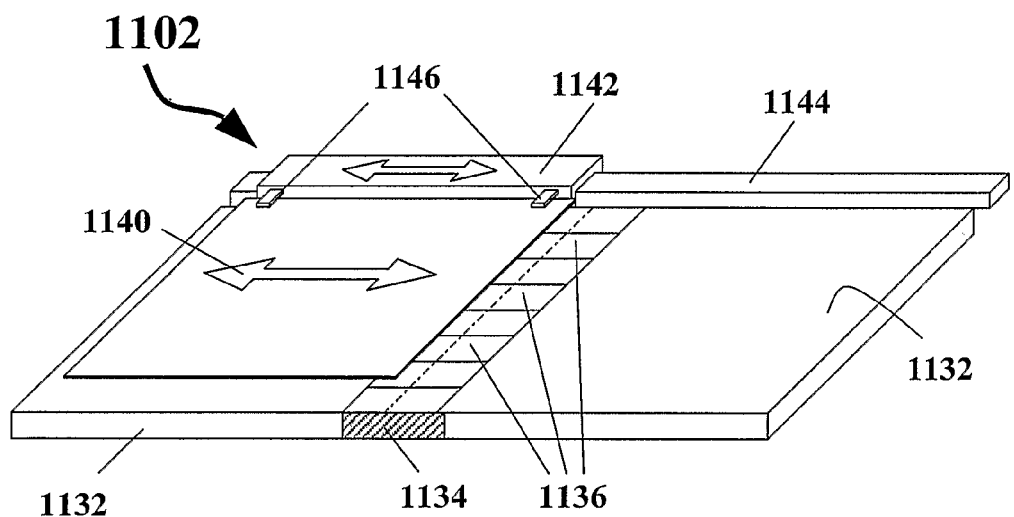
Fig. 11b

NON-CONTACT SUPPORT PLATFORMS FOR DISTANCE ADJUSTMENT

CROSS-REFERENCE TO RELATED APPLICATIONS

This application is a National Phase Application of PCT International Application No. PCT/IL2005/000390, entitled "Non-Contact Support Platforms for Distance Adjustment", International Filing Date Apr. 13, 2005, published on Oct. 27, 2005 as International Publication Number WO 2005/099350; which in turn claims priority from United States Provisional Patent Application No. 60/561,904, filed on Apr. 14, 2004, both of which are incorporated herein by reference in their entirety.

FIELD OF THE INVENTION

The invention relates to methods and systems of local and global distance adjustment and to non-contact support platforms.

BACKGROUND OF THE INVENTION

In existing systems implemented, for example, as part of a process for optical inspection of a surface of a substrate such a semiconductor (SC) thin wafer (700 micrometer and less) of circular shape, or as part of a SC Photolithography process, the wafer is attached to a supporting platform known as a "chuck", For executing such a process, it is required to vertically move the chuck, for example, relative to an optical device, (or alternatively to move vertically the optical device), in order to adjust in local manner the distance of the wafer facing surface with respect to an optical device. Such systems implement an electro-mechanical and/or a piezoelectric adjusting mechanism in order to provide the focusing in a relatively high degree of accuracy, e.g., in a magnitude of up to very few nanometers. Such systems may also implement a mechanism, known as a "stepper", to provide relative planer (XY) motion between the object and, for example, a stationary optical device. In many cases, the planer motion (scanning or point to point motion) required by the stepper may be very accurate in three-dimensional manner, e.g., in a magnitude of 10th and even few nanometers. Current systems implement linear motion, (for example, an accurate platforms that supports an linearly moves a thin (less than 1 mm), rectangular wide format Flat-Panel Display (FPD) that can be 6 m$^2$ in area), rotational motion and/or planar (XY) motion of the object in order to provide the lateral relative motion between the facing surface of the object and the optical device. Thus, the focal distance below the optical device must be dynamically adjusted, at least locally, in conjunction with laterally moving the object.

Accordingly, the throughput of such systems may be related to the time response of the focusing mechanism and /or the time-response of the lateral motion mechanism. For example, a relatively heavy chuck, may result in a relatively slow time response.

A different problem of malfunctioning may occur if a sub-micron particle, having for example, a size of 0.5 micrometer or more trapped between a wafer and the chuck, e.g., when the wafer is clamped by the chuck, for example, by vacuum or electrostatic mechanisms. The particle may cause local distortion of the wafer facing surface, which may result in a critical failure of, for example, inspection or photolithography process. Such a particle may generate non-parallelism of local nature (small bump) such that the focusing mechanism may not be able to compensate such local wafer distortion.

Furthermore, contact between substrates (such as silicon wafer), and chucks may results with damage, e.g., by causing backside contamination and/or Electro Static Damage (ESD), or mechanical damage to the wafer.

BRIEF DESCRIPTION OF THE INVENTION

There is thus provided, in accordance with some preferred embodiments of the present invention, an apparatus for supporting a stationary or moving substantially flat object without physical contact on an fluid-cushion, the object floating at a fluid cushion gap, the apparatus aimed for globally or locally adjusting the gap, the apparatus comprising:

a first platform for supporting the object without contact, the platform having a substantially flat active surface comprised of one or more sectors, each sector comprising at least one of a plurality of basic cells, each basic cell having at least one of a plurality of pressure outlets fluidically connected through a pressure flow restrictors to a higher-pressure manifold associated with the sector in which the basic cell lies, the higher-pressure manifold is fluidically connected through main supply pipeline to pressurized fluid supply and at least one of a plurality of fluid-evacuation channels fluidically connected to a lower-pressure manifold associated with the sector in which the basic cell lies having main evacuation pipeline;

wherein the flow restrictor characteristically exhibiting fluidic return spring behavior;

and wherein at least one pressure control valve is interposed with at least one of the two main pipelines of at least one sector for controlling pressure levels of at least one of the two manifolds of that sector.

Furthermore, in accordance with some preferred embodiments of the present invention, said at least one pressure control valve is interposed with the main supply pipeline between the higher-pressure manifold of at least one sector to the pressurized fluid supply, for controlling the pressure level at the higher-pressure manifold.

Furthermore, in accordance with some preferred embodiments of the present invention, said at least one pressure control valve is interposed with the main evacuation pipeline, for controlling the pressure level of at least one sector at the lower-pressure manifold.

Furthermore, in accordance with some preferred embodiments of the present invention, one pressure control valve is interposed with the main supply pipeline, and a second pressure control valve is interposed with the main evacuation pipeline, for allowing differential gap control of at least one sector.

Furthermore, in accordance with some preferred embodiments of the present invention, the gap is in the range of 100-500 microns.

Furthermore, in accordance with some preferred embodiments of the present invention, said at least one pressure control valve is adapted to increase or decrease the gap by adjusting the gap in a range between 50-250 microns.

Furthermore, in accordance with some preferred embodiments of the present invention, the lower-pressure manifold of each sector is fluidically connected through the main evacuation pipeline to a sub-atmospheric pressure reservoir, thus the pressure outlets and the fluid-evacuation channels maintain a vacuum preloaded fluid-cushion between the supported object and the active-surface of the platform.

Furthermore, in accordance with some preferred embodiments of the present invention, the gap is in the range of 10-100 microns.

Furthermore, in accordance with some preferred embodiments of the present invention, said at least one pressure control valve is adapted to increase or decrease the gap by changing the gap in a range between 5-50 microns.

Furthermore, in accordance with some preferred embodiments of the present invention, said at least one or more sectors comprises only one sector for global gap adjustment.

Furthermore, in accordance with some preferred embodiments of the present invention, the pressure flow restrictor comprises a self-adaptive segmented orifice (SASO) flow restrictor.

Furthermore, in accordance with some preferred embodiments of the present invention, a flow restrictor is provided, interposed between said at least one of a plurality of fluid-evacuation channels and the lower pressure manifold.

Furthermore, in accordance with some preferred embodiments of the present invention, the vacuum flow restrictor comprises a self-adaptive segmented orifice (SASO) flow restrictor.

Furthermore, in accordance with some preferred embodiments of the present invention, the active surface is circular.

Furthermore, in accordance with some preferred embodiments of the present invention, the sectors are of annular shape, arranged in an annular and concentric manner.

Furthermore, in accordance with some preferred embodiments of the present invention, the active surface is rectangular.

Furthermore, in accordance with some preferred embodiments of the present invention, the sectors are substantially of rectangular shape, arranged substantially in parallel.

Furthermore, in accordance with some preferred embodiments of the present invention, the apparatus is further provided with at least one adjacent non-contact support platform with an active surface that is substantially on the same plane as the active surface of the apparatus.

Furthermore, in accordance with some preferred embodiments of the present invention, the sectors are separated by intermediary passive zones.

Furthermore, in accordance with some preferred embodiments of the present invention, the surfaces of the intermediary passive zones are lower than the surface of the active zone.

Furthermore, in accordance with some preferred embodiments of the present invention, the apparatus is further provided with motion mechanism for moving the object, the platform or both.

Furthermore, in accordance with some preferred embodiments of the present invention, the motion mechanism comprises a rotation mechanism for rotating the object or the platform.

Furthermore, in accordance with some preferred embodiments of the present invention, the motion mechanism comprises a linear motion mechanism for linearly moving the object or the platform.

Furthermore, in accordance with some preferred embodiments of the present invention, the motion mechanism comprises a planar motion mechanism for moving the object or the platform across a plane.

Furthermore, in accordance with some preferred embodiments of the present invention, a control unit controls the motion mechanism.

Furthermore, in accordance with some preferred embodiments of the present invention, the active surface includes one or more service openings.

Furthermore, in accordance with some preferred embodiments of the present invention, the apparatus is further provided with at least one auxiliary device.

Furthermore, in accordance with some preferred embodiments of the present invention, said at least one auxiliary device is selected from tile group of auxiliary devices containing: landing mechanism, limiters, aligners, grippers, floating grippers.

Furthermore, in accordance with some preferred embodiments of the present invention, said at least one auxiliary device is provided with a flexure.

Furthermore, in accordance with some preferred embodiments of the present invention, said at least one auxiliary device is supported by a fluid cushion.

Furthermore, in accordance with some preferred embodiments of the present invention, at least one piston is provided for changing the volume of at least one manifold of at least one sector.

Furthermore, in accordance with some preferred embodiments of the present invention, a control unit controls said at least one piston, Furthermore, in accordance with some preferred embodiments of the present invention, the fluid of the fluid cushion is air, whereby an air-cushion support is provided.

Furthermore, in accordance with some preferred embodiments of the present invention, the apparatus further comprises an intermediate plate to be supported by the fluid-cushion generated by the platform, whereas the intermediate plate supports the object with contact.

Furthermore, in accordance with some preferred embodiments of the present invention, the apparatus is further provided with a peripheral flexible insulating element for insulating and secluding the fluid-cushion between the intermediate plate and the active surface of the platform.

Furthermore, in accordance with some preferred embodiments of the present invention, the apparatus further comprises an intermediate plate to be supported by the fluid-cushion generated by the platform, whereas the intermediate plate supports the object without contact.

Furthermore, in accordance with some preferred embodiments of the present invention, a control unit is provided for globally or locally adjusting the gap by controlling at least one pressure control valve of said one or more sectors.

Furthermore, in accordance with some preferred embodiments of the present invention, the apparatus is further provided with at least one sensor communicating with the control unit.

Furthermore, in accordance with some preferred embodiments of the present invention, said at least one sensor is selected from the group containing: proximity sensors, position sensors, distance sensors, pressure level sensors, thickness sensors.

Furthermore, in accordance with some preferred embodiments of the present invention, the fluid cushion gap is adjusted globally or locally in respect to the distance between (a) the surface of a thin and substantial flat object that is facing the active surface of the platform, and (b) the active surface of the platform.

Furthermore, in accordance with some preferred embodiments of the present invention, the fluid cushion gap is adjusted globally or locally in respect to the distance between (a) the top surface of a thin and substantial flat object supported by the platform, and (b) a tool engaged above the platform, or a virtual reference.

Furthermore, in accordance with some preferred embodiments of the present invention, the apparatus is further provided with a second opposing platform, the second opposing platform comprising a substantially flat active surface comprising at least one of a plurality of basic cells, each basic cell having at least one of a plurality of pressure outlets fluidically connected through a pressure flow restrictors to a higher-pressure manifold, the higher-pressure manifold is fluidically connected through main supply pipeline to pressurized fluid supply and at least one of a plurality of fluid-evacuation channels fluidically connected to a lower-pressure manifold connected to a main evacuation pipeline, wherein the active-surface of the opposing platform is substantially identical to the first platform, assembled substantially in parallel and in a mirror symmetry with respect to the first platform thus creating a dual-sided support of the object.

Furthermore, in accordance with some preferred embodiments of the present invention, the active surface of the second opposing platform is divided into separately controllable sectors.

Furthermore, in accordance with some preferred embodiments of the present invention, the lower-pressure manifold of at least one sector of at least one of the two opposing platforms is fluidically connected through the main evacuation pipeline of said at least one sector to a sub-atmospheric pressure reservoir, for creating a vacuum preloaded fluid-cushion.

Furthermore, in accordance with some preferred embodiments of the present invention, the distance between the two opposing platforms is predetermined by the anticipated nominal thickness of the object and the two gaps of the fluid cushions.

Furthermore, in accordance with some preferred embodiments of the present invention, the dual side configuration is operated where the pressure-level and the sub-atmospheric pressure supplied to the first platform are different from the pressure-level and the sub-atmospheric pressure level supplied to the second opposing platform.

Furthermore, in accordance with some preferred embodiments of the present invention, facing sectors are simultaneously controlled for allowing differential gap control.

Furthermore, in accordance with some preferred embodiments of the present invention, the facing sectors are identical.

Furthermore, in accordance with some preferred embodiments of the present invention, at least one of the platforms includes at least one service opening for facilitating access to or view of the object.

Furthermore, in accordance with some preferred embodiments of the present invention, the active surface of the platform is facing a substantial flat surface and floating over that surface, whereas the floating gap is controlled locally or globally by at least one pressure control valve to allow distance and parallelism control.

Furthermore, in accordance with some preferred embodiments of the present invention, the platform is adapted to travel laterally across the flat surface by motion mechanism, and supporting the object.

Furthermore, in accordance with some preferred embodiments of the present invention, the platform is adapted to hold a process tool, for locally or globally adjusting the distance of the tool with respect to a predetermined reference.

Furthermore, in accordance with some preferred embodiments of the present invention, the platform is adapted to hold an optical device for aero-mechanic focusing.

Furthermore, in accordance with some preferred embodiments of the present invention, the apparatus is further provided with an effectively rigid floating relatively thin and wide handling element for holding or moving the object, the element is adapted to be supported by an AM-stiff fluid-cushion aimed to create combined effective stiffness.

Furthermore, in accordance with some preferred embodiments of the present invention, there is provided a method for regulating globally or locally the floating gap or the flatness of a substantially flat object, the method comprising:

providing a first platform for supporting the object without contact, the platform having a substantially flat active surface comprised of one or more sectors, each sector comprising at least one of a plurality of basic cells, each basic cell having at least one of a plurality of pressure outlets fluidically connected through a pressure flow restrictors to a higher-pressure manifold associated with the sector in which the basic cell lies, the higher pressure manifold is fluidically connected through main supply pipeline to pressurized fluid supply and at least one of a plurality of fluid-evacuation channels fluidically connected to a lower-pressure manifold associated with the sector in which the basic cell lies having main evacuation pipeline; wherein the flow restrictor characteristically exhibiting fluidic return spring behavior; and wherein at least one pressure control valve is interposed with at least one of the two main pipelines of at least one sector for controlling pressure levels of at least one of the two manifolds of that sector;

maintaining a fluid cushion;

positioning the object over the fluid cushion; and regulating locally or globally by at least one pressure control valve the floating gap or flatness of the object by sector control.

Furthermore, in accordance with some preferred embodiments of the present invention, the method is used for adjusting a distance between a facing surface of the object and a reference element.

Furthermore, in accordance with some preferred embodiments of the present invention, the method is used for focusing a surface of the object against an optical device.

Furthermore, in accordance with some preferred embodiments of the present invention, the method is used for focusing an optical device on a surface of an item.

Furthermore, in accordance with some preferred embodiments of the present invention, the method is used to adjust parallelism of a surface of the object with respect to a reference plane.

Furthermore, in accordance with some preferred embodiments of the present invention, the method is used to adjust parallelism of a surface of the object, when forces are applied on the object.

Furthermore, in accordance with some preferred embodiments of the present invention, the method further comprises receiving feedback information for closed or open control loop.

Furthermore, in accordance with some preferred embodiments of the present invention, the method is used for global or local auto-focusing.

Furthermore, in accordance with some preferred embodiments of the present invention, the method is used for manipulating the curvature of a surface of the object.

Furthermore, in accordance with some preferred embodiments of the present invention, the method is used for manipulating the curvature of a surface of the object, when forces are applied on the object.

Furthermore, in accordance with some preferred embodiments of the present invention, manipulating the curvature is carried out in order to facilitate uniform force across the object.

Furthermore, in accordance with some preferred embodiments of the present invention, the method is used for pre-calibration of flatness of the active surface of the platform.

Furthermore, in accordance with some preferred embodiments of the present invention, the method further comprises providing a second opposing platform, the second opposing platform comprising a substantially flat active surface comprising at least one of a plurality of basic cells, each basic cell having at least one of a plurality of pressure outlets fluidically connected through a pressure flow restrictors to a higher-pressure manifold, the higher-pressure manifold is fluidically connected through main supply pipeline to pressurized fluid supply and at least one of a plurality of fluid-evacuation channels fluidically connected to a lower-pressure manifold connected to a main evacuation pipeline, wherein the active-surface of the opposing platform is substantially identical to the first platform, assembled substantially in parallel and in a mirror symmetry with respect to the first platform thus creating dual-sided support of the object.

Furthermore, in accordance with some preferred embodiments of the present invention, the object is supported in a stationary position.

Furthermore, in accordance with some preferred embodiments of the present invention, a controlled relative scan motion is provided between the object and a process tool.

Furthermore, in accordance with some preferred embodiments of the present invention, a controlled relative point-to-point motion is provided between the object and a process tool.

Furthermore, in accordance with some preferred embodiments of the present invention, in addition to fluid cushion gap adjustment features, the apparatus is capable to assist the process.

Furthermore, in accordance with some preferred embodiments of the present invention, in addition to fluid cushion gap adjustment features, the apparatus is capable execute a process.

BRIEF DESCRIPTION OF THE DRAWINGS

The subject matter regarded as the present invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

FIGS. 5-7 schematically illustrate some peripheral equipment associated with non-contact supporting platforms.

FIGS. 11a-11d are schematic illustrations of various wide-format non-contact platforms that provided with aeromechanical means for global or local adjustment of the fluid-cushion gap.

Figure 1:
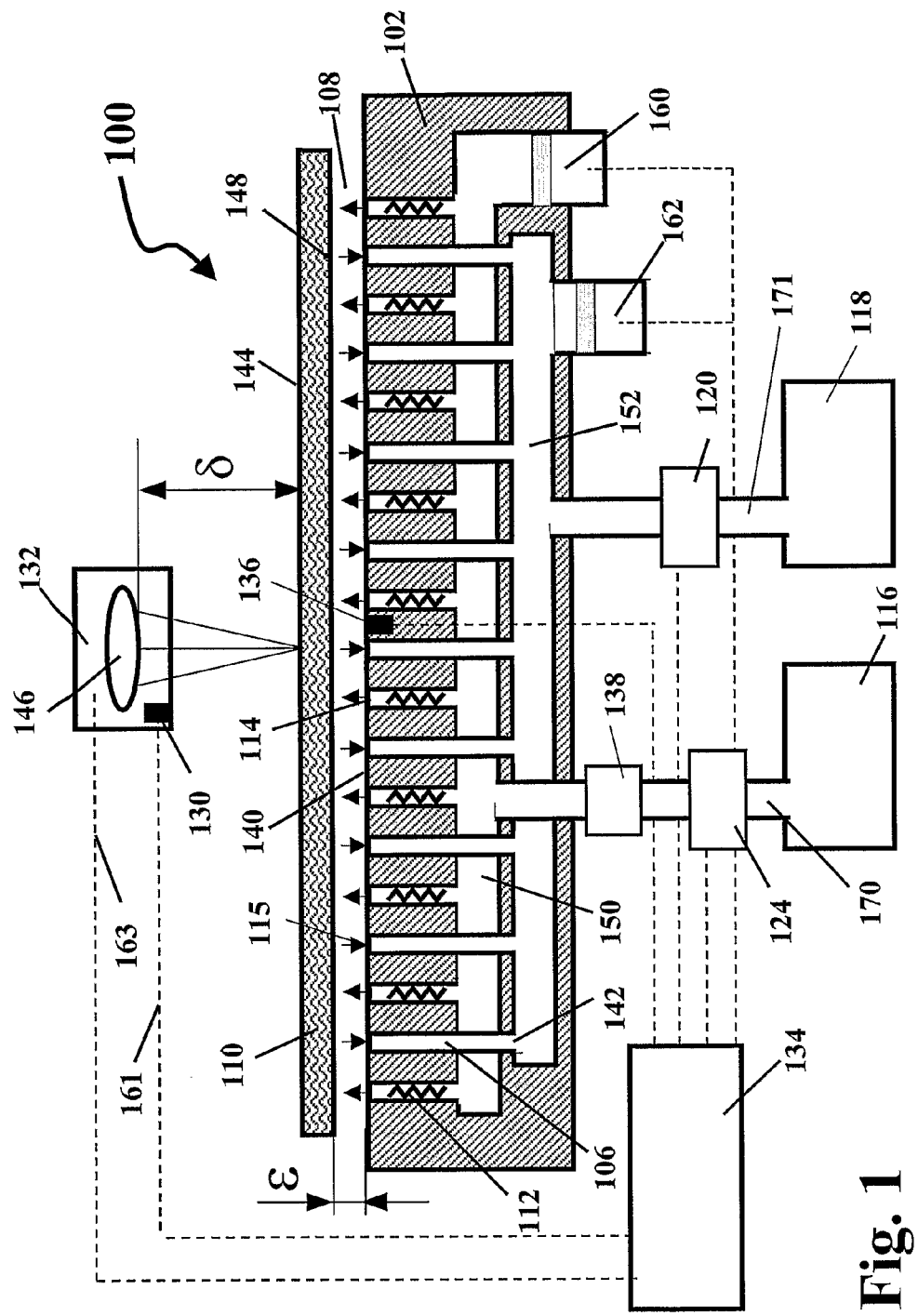
FIG. 1 is a schematic, cross-sectional illustration of an apparatus based on a non-contact supporting platform where the apparatus has aeromechanical means for global adjustment of the fluid-cushion gap.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the present invention. However, it will be understood by those of ordinary skill in the art that the present invention may be practiced without these specific details. In other instances, well-known methods, procedures, components and circuits have not been described in detail so as not to obscure the present invention.

It will be appreciated that for simplicity and clarity, that the term "adjust" means adjustment of the distance between a facing surface of an object to a reference device or to virtual reference. The terms "focusing" with respect to the present invention is similar to "adjusting" and it frequently used with respect to optical oriented systems. This direction is intuitively regarding to as the vertical direction that is substantially normal to the facing surface of the object. The term "positioning", with respect to the present invention, means to move laterally the object in a plane that is the substantially normal to the vertical direction.

It will be appreciated that for simplicity and clarity that in many cases the term substrate will be used as the object that is facing a device, at a distance that is adjusted by aeromechanical (AM) means. It will be appreciated that for simplicity and clarity that the term "AM" means also "fluid-mechanics" means, as although in many cases gases like air are involve, in some other cases liquid may also considered with respect to the essence of the present invention. For generalization purposes, the term "fluid cushion" will by used in the present invention. However, in most cases air will be the fluid and accordingly the term "fluid cushion" means in many cases "air-cushion". The expressions "AM-means" or "AM adjusting means" with respect to the present invention are means to adjust the fluid-cushion gap by controlling locally or globally the presser levels provided to a non-contact platform, or to each sector of a non-contact platform as will be described hereafter.

In the following detailed description, the term "auto-focusing" relates to vertically adjusting in a dynamical manner the facing surface of an object or a point on it in a desired distance from an optical device by using open or closed loop control.

Embodiments of the present invention provide an apparatus and method for locally or globally adjusting, by AM means, the distance from the facing surface of an object to a reference device, the parallelism of a facing surface of an object with respect to a reference plane, and the flatness or the curvature or forces applied on the a facing surface of the object itself, while the object, being stationary or in motion, is supported substantially without contact by a fluid-cushion, or being held with contact by an intermediate plate or by the non-contact platform itself.

According to some exemplary embodiments of the invention, the object may be a relatively thin and/or relatively round object, e.g., a round silicon wafer, or a wide format rectangular FPD glass.

According to exemplary embodiments of the invention, adjusting by AM means is achieved by controlling locally or globally the gap of fluid-cushion formed between the object and the active surface of the non-contact support platform that support the object.

Reference is made to FIG. 1, which schematically illustrates a cross-section of an apparatus 100 having non-contact platform 102 for supporting an object 110 without contact, according to an exemplary embodiment of the present invention. Apparatus 100,has aeromechanical (AM) means for controlling globally the gap 8 of the fluid-cushion 108 generated by the active surface 140 of platform 102 that facing the object 110. The object, for example, may be a silicon wafer.

According to an exemplary embodiment of the invention, apparatus 100 includes non-contact platforms 102 generating fluid-cushion 108 to support object 110. Embodiments of such non-contact supporting platforms are disclosed in International Patent Application PCT/IL02/01045, filed Dec. 27, 2002, entitled "HIGH-PERFORMANCE NON-CONTACT SUPPORT PLATFORMS" and published Jul. 24, 2003, as PCT Publication WO 03/060961 (Reference-1), now a US patent application published as US 2006/0054774, the full disclosure of which is incorporated herein by reference.

Embodiments of the device, system and/or method of the present invention implement such non-contact support platforms as disclosed in Reference-1. Other embodiments of the devices, systems and/or methods of the present invention may implement any other suitable non-contact support platforms or elements.

According to exemplary embodiments of the invention, platform 102 may include a vacuum preloaded (PV-type) non-contact support platform as described in reference-1. The active surface 140 of supporting platform 102, includes at least one of a plurality of basic cells, each basic cell has one or more pressure outlets 114 and one or more fluid evacuation channels 106. Each of pressure outlets 114 is fluidically connected through a respective pressure flow restrictor 112 to a higher-pressure manifold 150. Manifold 150 is fluidically connected through the main supply pipeline 170 to a high-pressure reservoir 116, e.g., provided by a pump or any other suitable device for providing a desired pressure value at a desired mass flow rate. According to some exemplary embodiments, a filter 138, e.g., a sub-micron filter for filtering the incoming fluid may be implemented, for example, between reservoir 116 and manifold 150. Each of the fluid evacuation channels 106, having inlets 115 at the active-surface 140 of platform 102, is fluidically connected to the low-pressure manifold 152. Manifold 152 is fluidically connected though the main evacuation pipeline 171 to a lower pressure source 118, for example, using a vacuum pump or vacuum source as shown in the figure, adapted to provide a desired vacuum level.

Pressure outlets 114 and inlets 115 may provide pressure-induced forces to maintain a supporting fluid cushion 108 in a gap $\epsilon$ between surface 140 and the facing down surface 148 of object 110. The pressure flow restrictor 112 may characteristically exhibit a fluidic return spring behavior. For example, flow restrictor 112 may be the Self Adapted Segmented Orifice (SASO) nozzle, e.g., as described in International Application PCT/IL00/00500, filed Aug. 20, 2000, entitled "APPARATUS FOR INDUCING FORCES BY FLUID INJECTION" and published Mar. 22, 2001 as PCT Publication WO 01/19572, now U.S. Pat. No. 6,523,572 (Reference-2), the disclosure of which is incorporated herein by reference.

As described in reference 1, A non-contact vacuum preloaded (PV) platform 102 generates a clamping PV fluid-cushion 108 by outlets 114 and inlets 115 of the active surface 140 of platform 102 where the object 110 is in equilibrium clamped without contact at a gap $\epsilon$. Outlets 114 may provide upward forces induced on surface 148, and evacuation inlets 115 may provide down ward forces induced on surface 148.

According to some embodiments of the present invention, one or more of vacuum channels 106 may optionally include a flow restrictor, e.g., similar to the flow restrictor described by Reference-2, which may be characterized by a relatively lower aero-mechanic resistance in comparison to restrictor 112. Implementation of flow-restrictors for evacuation channels, as well as flow restrictors 112, is very important in cases where the active surface 140 is not fully covered by object 110 as mass flow through the flow restrictor is limited.

As described in reference 1, the PV-type fluid cushion upwards pressure forces may increase significantly in reaction to even a slight decrease in the gap, consequently forcing a counter increase in the gap such that the equilibrium nominal gap may be maintained. Conversely, the PV-type fluid-cushion pressure forces may increase significantly in reaction to even a slight increase in the gap, consequently forcing a counter decrease in the gap such that the equilibrium nominal gap may be maintained. This constellation of counter forces results in a stable equilibrium, whereby the gap 8 may be accurately maintained. Furthermore, the PV-type clamping platform may be implemented as part of an "upside-down" or vertical setup, e.g., for upside-down or vertical non-contact support of an object, as described in reference-1.

Apparatus 100 includes at least one pressure control device. Apparatus 100 may include a pressure control valve 124 ($CV_1$) interposed with the main supply pipeline 170 to regulate the pressure level at the high-pressure manifold 151. Apparatus 100 may include alternatively or additionally, pressure control valve 120 ($CV_2$) interposed with the main evacuation pipeline 171 to regulate the pressure level at the low-pressure manifold 152. It will be appreciated by those skilled in the art, that system 100 may additionally or alternatively include any other suitable pressure and/or vacuum control devices as are known in the art.

According to some exemplary embodiments of the invention, the fluid cushion gap 8 may be in the range of 5 μm to 100 μm or higher. The pressure level at the high-pressure manifold may be between 10 mbar and 500 mbar, and the lower (sub-atmospheric) pressure level at the low-pressure manifold may be between 5 mbar and 300 mbar However, it will be appreciated that according to other embodiments of the invention, any other suitable pressure levels may be implemented.

According to some exemplary embodiments of the invention, pressure level at the high pressure manifold 150 may be increased or decreased by condoling valve 124 while the lower pressure level at the low pressure manifold 152 is not controlled. Accordingly the fluid-cushion gap $\epsilon$ is increased when pressure level of 150 is increased and decreased when pressure level of 150 is decrease. Alternatively, pressure level at the low pressure manifold 152 may be increased or decreased by controlling valve 120 while the higher pressure level at the high pressure manifold 150 is not controlled. Accordingly the fluid- cushion gap $\epsilon$ is increased when pressure level of 152 is increased and decreased when pressure level of 150 is decrease. In both cases the pressure variations imposed by values 120 and 124 may be in the range between much less than a millibar up to several tenths of the pre-determined operational pressure levels. Consequently, the fluid-cushion gap $\epsilon$, may be changed in the range between few 10'th of nanometers up to several tenths of the pre-determined fluid cushion nominal gap. In such cases the sensitivity of this AM-adjusting mechanism can be few 10'th of nanometer per a change of about 1 millibar in pressure levels of 150 or 152.

According to some exemplary embodiments of the invention, pressure levels at both the high-pressure manifold 150 and the low-pressure manifold 152 may be increased simulators in order to adjust the fluid-cushion gap $\epsilon$ in very sensitive way. For example, by increasing pressure level of 150 and at the some time reducing the pressure level at 152 according to a pre-determined table, a very sensitive AM-mechanism of fluid-cushion gap 8 adjustment is created. Alternatively, by reducing pressure level of 150 and at the some time increasing the pressure level at 152 according to optionally another pre-determined table, a very sensitive AM-mechanism of fluid-cushion gap $\epsilon$ adjustment is created. Such a simultaneous adjustments will be referred to hereafter as "differential adjusting mode" that provide high sensitivity of gap $\epsilon$ adjustment (few nanometer per a change of about 1 millibar in pressure levels of both 150 and 152).

According to some exemplary embodiments of the invention, apparatus 100 may include a piston 160 connected to manifold 150, and/or piston 162, fluidically connected to manifold 152. Piston 160 and/or piston 162 may be controlled, e.g., by control unit 134, to provide temporal fine-tuning and/or fast response of the pressure level at manifolds 150 and 152.

According to embodiments of the invention, the control unit 134 of apparatus 100 may control the pressure control valves 120 and 124 and pistons 160 and 162 for adjusting the fluid-cushion gap $\epsilon$. Accordingly, apparatus 100 may be implemented, by controlling the fluid cushion gap $\epsilon$, for globally controlling the vertical distance 3 between the facing surface 144 of object 110 and a reference device 132 mounted above, to allow, for example, focusing of at least a segment of surface 144, with respect to an optical device 132 having lens 146, as illustrated in FIG. 1. It will be appreciated by those skilled in the art that distance $\delta$ may be increased or decreased in relation decreasing or increasing gap size $\epsilon$ respectively. Accordingly, the distance 6 may be increased or decreased in a range corresponding to the range of changing of the gap 8 as previously mentioned. The sensitively of adjustment of $\delta$ with respect to a change of the pressure levels at 150 and 152, is also corresponding to the sensitivity of changing the gap $\epsilon$ as previously mentioned.

According to some exemplary embodiments of the invention, control unit 134 of apparatus 100 may be able to implement an open-loop control for controlling the distance $\delta$—and by that to establish an open loop AM adjusting mechanism, for example, an open-loop auto-focus mechanism associated with optical devices. Control unit 134 may be provided with a predetermined correlation between values of $\epsilon$ and corresponding values of the pressure levels of 150 and 152. e.g., in the form of a Look Up Table (LUT) based on, e.g., previously obtained, calibration data. Control unit 134 may control at least one of the valves 120 or 124 as well as pistons 160 and 162.

It will be appreciated by those skilled in the art that a relatively short response-time for adjusting the distance $\delta$ to a reference device 132, with a desired accuracy, may be achieved by implementing the open-loop AM adjusting mechanism described above. In addition it is mostly important to emphasize that response-time may be very short when a low weight object 110 is being clamped by the vacuum pre-loaded non-contact platform 102, as only the mass of the object 110 is being moved.

Unit 134 may also implement data from preliminary measurements, e.g., corresponding to an overall non-flatness and or thickness of wafer 110 or the facing surface 140 of 102.

According to other exemplary embodiments of the invention, control unit 134 may be able to implement a closed-loop control controlling the distance $\delta$, as described below, and by that to establish a close-loop AM adjusting mechanism, for example, a closed-loop auto-focus mechanism associated with optical devices.

According to some exemplary embodiments of the invention, control unit 134 may be provided with a group of various sensors for receiving feedback data by 134 of apparatus 100 when closed-loop control is implemented. Without derogating the generality, the following sensors may be incorporated with respect to apparatus 100, needed for general controlling the process and for getting feedback signals when a closed-loop control by AM-means is implemented:

Proximity sensor (136) as are known in the art for sensing the gap $\epsilon$ Distance sensor (130) as are known in the art for sensing the distance $\delta$ Pressure sensors for measuring the pressure levels at 150 and 152

Sensors for receiving data about the positioning status of valves 120 and 124

Sensors for receiving data about the positioning status of pistons 160 and 162

Sensor for measuring the thickness of object 110 (not shown)

Sensor 130 and/or sensor 136 may each include any suitable optical or other non-contact distance-sensing device, for example, a Photoelectric-based sensing device or a capacitive sensing device, as are known in the art.

According to some exemplary embodiments of the invention, unit 134 may implement any suitable algorithm able to process any desired data. For example, the algorithm may process pre-processing data of previous operations. Additionally or alternatively, the algorithm may process preliminary data, e.g., corresponding to mechanical non-flatness of the supporting platform and/or corresponding to inherent non-accuracy apparatus and/or corresponding to non-flatness and thickness of object 100.

According to some exemplary embodiments of the invention, object 110 may be laterally positioned with respect to device 132, for example, by laterally moving wafer 110, platform 102 and/or device 132, e.g., as described below. Adjusting of at least a segment of object 110 with respect to device 132 may be achieved by controlling the distance $\delta$ as described above, when object 100 is stationary on being in a relative lateral motion with respect to device 132.

According to another exemplary embodiments of the present invention, the adjusting desired accuracy of apparatus 100 may be of order of micrometers or even 10'th of micrometers. In that case, it is possible to introduce the outlet of the main evacuation pipeline 171 directly to the ambient pressure. In that case, the active surface 140 of platform 102 generates a PA-type fluid cushion as described in Reference-1. Accordingly, platform 102 will be a PA-type non-contact supporting platform for supporting object 10 substantially without contact. Typical fluid cushion gaps ϵ for PA-type platform are in the range of 100-500 micrometers In has to be distinguished that while the stability of PV-type platforms that clamp the object without contact characterized by very high dumping (e.g. a very stable non-contact support is provided, the PA-type platforms are of much reduce performance with respect to stability and accuracy (as previously mentioned), when low-weight objects are supported, for example, the weight of a silicon wafer or a FPD glass of typical thickness of 0.7 mm thin is about 0.2 gram/cm$^2$. However, when much heavy object is supported by a PV-type platform, the object bodyweight pre load the fluid cushion, and as a result performances with respect to accuracy and stability are significantly improved. Accordingly, Implementation PA-platforms for distance adjustment by AM means is recommended mostly when it supports heavy objects, and accuracy is limited to the boundary of not less than few micrometers. In addition, it is recommended to use PV-platform when the object is not flat as PV-platform has an inherent ability to flatten non-flat, for example, substrates like thin wafer or wide format thin FPD glass, as PA-platforms can not flatten such thin substrates.

According to embodiments of the invention platform 102 may include any suitable predetermined platform configuration, e.g., as described below.

Figure 2A:
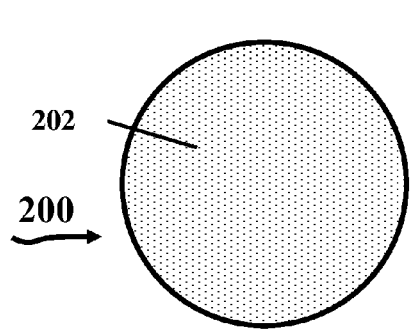
FIGS. 2a-2c are schematic illustrations of several active-surfaces of the non-contact supporting platform of the apparatus of FIG. 1
Figure 2B:
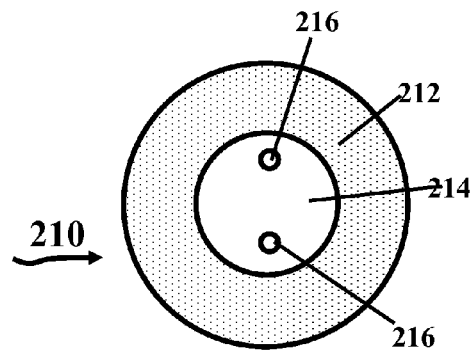

Reference is also made to FIGS. 2a and 2b, which schematically illustrate top-views of surface 140 corresponding to a platform configuration 200 and a platform configuration 210, respectively, in accordance with exemplary embodiments of the invention.

According to an exemplary embodiment of the invention, platform 200 may include a round active-surface 202.

According to another exemplary embodiment, round configuration 210 may include one annular active-surface 212. It will be noted that the area of section 212 may be large enough to globally support object 110. Configuration 210 may also include a non-active section 214, which may at the same level or lowered in relation to section 212. Section 214 may also include one or more evacuation holes 216 capable of evacuating fluid accumulated over section 214, in order, for example, to reduce any pressure forces, which may be induced by the fluid cushion maintained over section 212. Landing mechanism as describe below may be added at surface 214, optionally by incorporated this mechanism with some of holes 216.

Figure 2C:
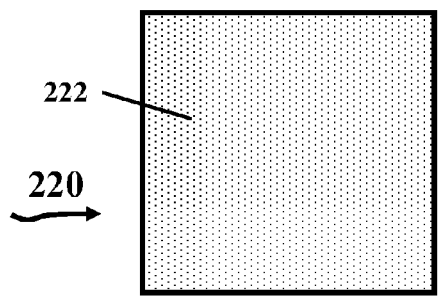

It will be appreciated by those skilled in the art that according to other embodiments of the invention, any other suitable platform configuration may be implemented by platform 102. Rectangular platforms are included in the scope of the present invention as shown in FIG. 2c. According to an exemplary embodiment of the invention, rectangular platform 220 includes a rectangular active-surface 222.

Figure 3:
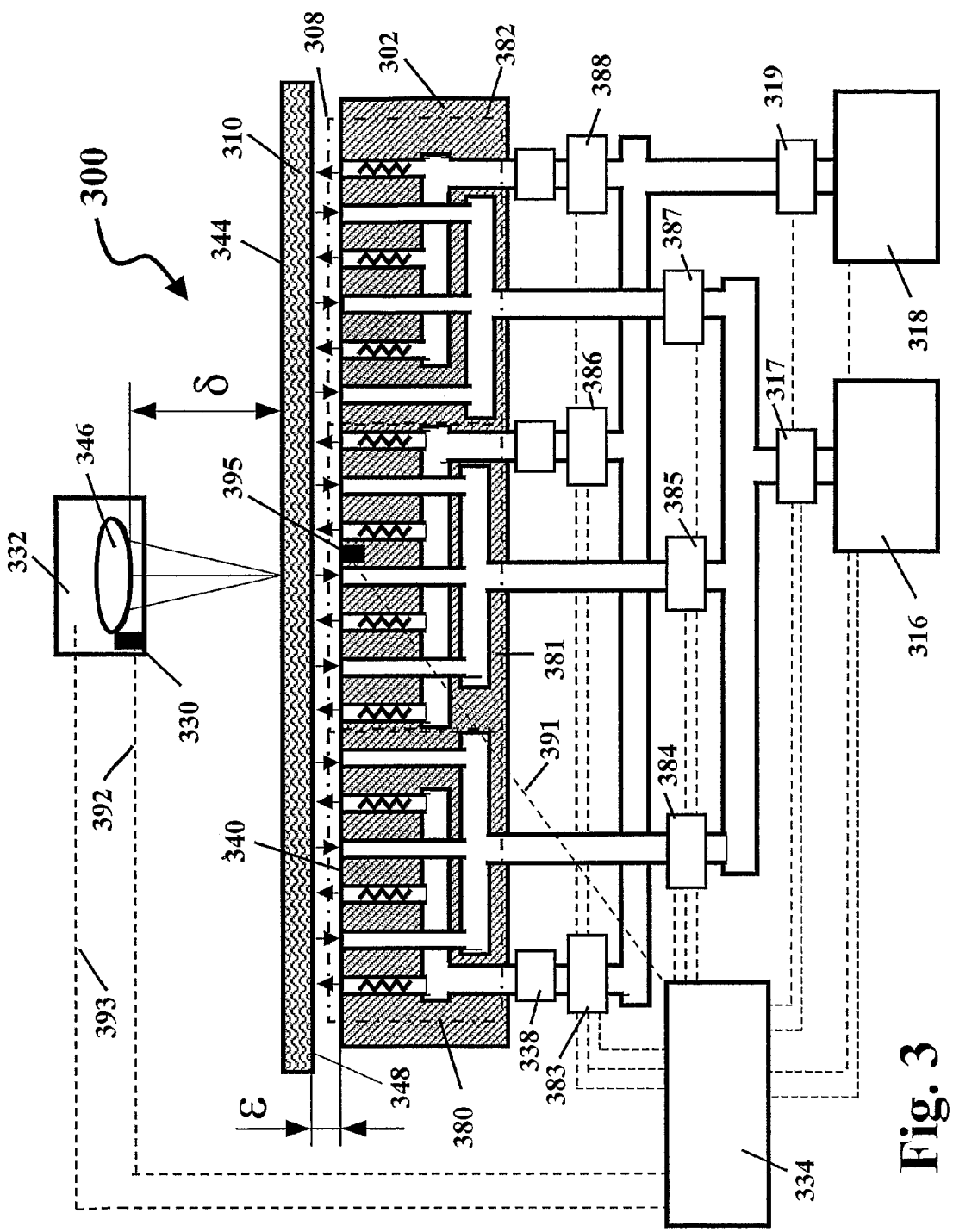
FIG. 3 is a schematic, cross-sectional illustration of an apparatus based on a non-contact supporting platform where the active surface of the platform is divided to two or more individually controllable sectors, where the apparatus has aeromechanical means for global or local adjustment of the fluid-cushion gap.
Figure 4A:
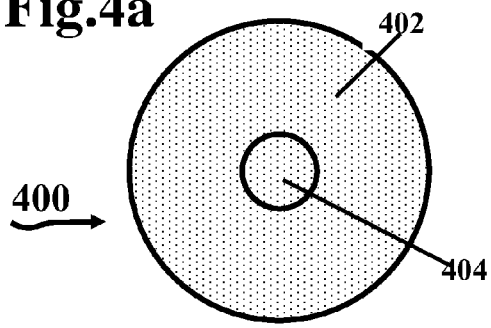
FIGS. 4a-4f are schematic illustrations of active-surface of the supporting platform of the apparatus of FIG. 3, where several sector's arrangements are shown.
Figure 4B:
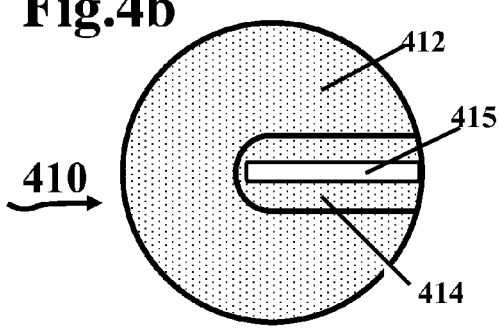
Figure 4C:
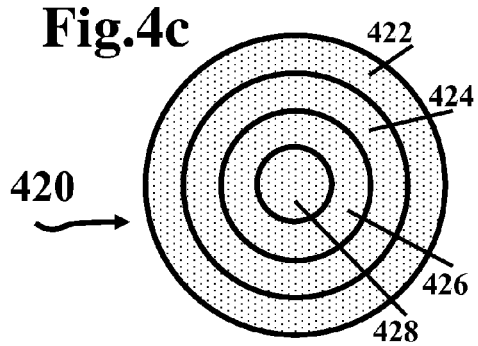
Figure 4D:
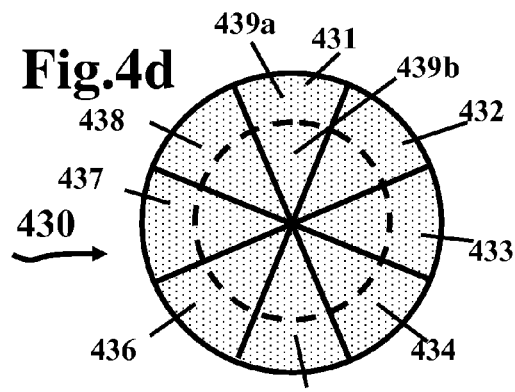
Figure 4E:
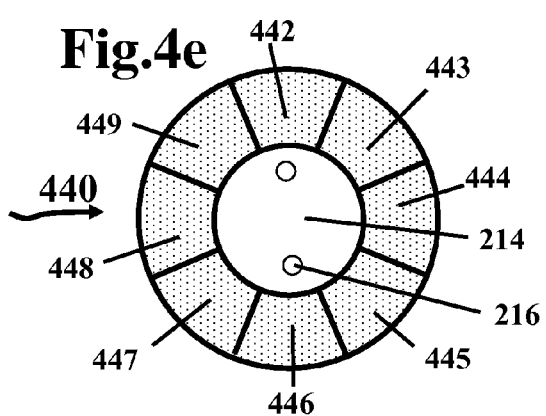
Figure 4F:
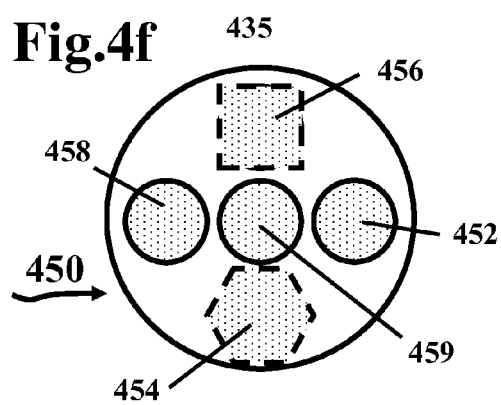

Reference is now made to FIG. 3, which schematically illustrates a cross-section of apparatus 300, according to another exemplary embodiment of the present invention. Apparatus 300 may include a non-contact support platform 302 adapted to support object 310 without contact by fluid cushion 308. According to exemplary embodiments of the invention, platform 302 may include a PV-type non-contact support platform, e.g., an AM configuration to maintain a PV-type fluid cushion, as described in reference 1.

According to some exemplary embodiments, the active surface 340 of platform 302 of apparatus 300 may be divided into two or more sectors, e.g., sectors 380, 381 and 382. In most details, apparatus 300 is similar to apparatus 100 shown in FIG. 1, but as its active surface 340 is divided to two or more sector, a new option—to provide a local adjustment of the fluid-cushion gap ϵ is created by selectively controlling one or more of the sectors by using AM-means. Moreover, by dividing the active surface 340 of the non-contact supporting platform 302 to several sectors, it becomes possible to adjust not only the distance to a reference device 332 by AM-means, but also to parallel the facing surface 344 of object 310 in global or local manner with respect to a reference plane of 332. In addition, it becomes possible to adjust the flatness of the facing surface 344 of 310 relative to a virtual plane, also in cases where forces applied on surface 344. It also becomes possible to make more complicate manipulation of local manner on object 310 by using AM-means. Some examples are:

Manipulating the curvature of surface 344

Manipulating the forces when forces applied on surface 344

Manipulate the forces to become uniform over surface 344, when forces applied on surface 344

According to some exemplary embodiments of the present invention, at least one of the sectors may be controlled, simultaneously or separately by AM-means to adjust in a local or global manner the fluid-cushion gap ϵ between a segment of a top surface 340 of platform 302 and a corresponding segment of a surface 348 of object 310, e.g., opposite surface 340, as described below. Similar to platform 102 (FIG. 1), each of the sectors (380,381,382) of the active surface 340 of platform 302 may include one of a plurality of basic cells, each of the basic cell may include one or more pressure outlets fluidically connected by a respective restriction nozzle to higher-pressure manifolds (351, 355, 361) of each of the sectors, and one or more fluid evacuation channels fluidically connected to lower-pressure manifolds (353, 357, 359) of each of the sectors. Similar to apparatus 100 (FIG. 1), the higher-pressure manifold of each sector is fluidically connected through an individual main supply pipeline to a pressure source 318, ), and the lower-pressure manifold of each sector is fluidically connected through an individual main evacuation pipeline to a lower-pressure source, for example, vacuum source 316.

According to some exemplary embodiments of the present invention, for controlling the fluid cushion gap ϵ in local manner by AM-mans, one or more pressure control valves 383, 386, 388 may interposed with the individual main supply pipeline of each sector for controlling the pressure level at the higher pressure manifold of each sector, and/or one or more pressure control valves 384, 385, 387 may interposed with the individual main evacuation pipeline of each sector for controlling the pleasure level at the higher pressure manifold of each sector. By controlling pressure level at one of the two manifolds of each sector, the fluid cushion gap ϵ may adjust in a local manner by AM-means. As mentioned previously, by controlling simultaneously the pressure levels at both manifolds of each sector, the fluid cushion gap ϵ may adjust in a local manner by AM-means when adopting the sensitive differential adjusting mode.

According to some exemplary embodiments of the present invention, there are several optional arrangements that can by applied also of apparatus 300 which are similar to optional arrangements described with respect to apparatus 300. In order to simplify, some of the modification will be briefly simplified hereafter:

It is an option to add, at least to part of the sectors, flow restrictors in the evacuation channels in cases where part of the sectors are not covered.

It is an option to introduce, for at least to part of the sectors, the exit of the main evacuation pipeline to ambient pressure conditions, thus at least part of the sectors will generate PA-type fluid-cushions, thus in some cases the remaining sectors will generate a PV-type fluid cushion.

It is an option to add pistons to at least part of the manifolds of 300.

According to exemplary embodiments of the invention, system 300 may also include a control unit 334 capable of controlling the pressure levels at each manifold of each sector by using the pressure control valve interposed to the main pipelines of each sector. Optionally, the main operational valves 317 and 319 may control by 334.

According to embodiments of the invention, apparatus 300 may be implemented for adjusting in a local or global manner by AM-means the fluid cushion gap $\epsilon$.

According to embodiments of the invention, apparatus 300 may be implemented for adjusting in a local or global manner by AM-means the fluid cushion gap $\epsilon$, and by that to adjust in a local or global manner the distance $\delta$ between a segment of facing surface of the supported object and a reference device. Moreover, by adjusting in a local or global manner by AM-means the fluid cushion gap $\epsilon$, the parallelism between a segment of facing surface of the supported object and a reference plane may be adjusted in a local or global manner by AM-means.

According to some exemplary embodiments of the invention, control unit 334 may be able to implement an open-loop control or closed loop control for automatically adjusting $\delta$, with respect to a reference device. Control unit 334 may control pressure level at each of the sector of apparatus 300 and has similar feedback sensor as described with respect to control unit 134 of apparatus 100. Control unit 334 may control any of the lateral motion mechanism provided with apparatus 300 and any peripheral device.

According to some exemplary embodiments of the invention, control unit 334 may be able to implement an open-loop control or close loop control for auto-focusing $\delta$, with respect to a reference optical device.

According to some exemplary embodiments of the invention, the pressure levels provided to the manifolds of each sector of platform 302 may be controlled according to any desired spatial and/or temporal, scheme. For example, time-independently regulated locally or globally, e.g., for flatness and/or parallelism and/or vertical distance corrections, or for any other pre-process leveling, or for any pre-process calibration. The pressure levels provided to the manifolds of each sector of platform 302 may be controlled temporarily, time-dependently regulated, e.g., for adjusting locally or globally the fluid cushion gap $\epsilon$, both in cases where the object is being in rest or being in a relative lateral motion with respect a reference device.

According to embodiments of the invention platform 302 may include any suitable predetermined sector configuration including one or more sectors of any desired shape and size, e.g., as described below.

Reference is also made to FIGS. 4a-4f, which schematically illustrate top-views of the active surface 340 corresponding to sector configurations 400, 410, 420, 430, 440 and 450, respectively, in accordance with exemplary embodiments of the invention.

According to an exemplary embodiment of the invention, sector configuration 400 (FIG. 4a) may include external sector 402 and internal sector 404. This configuration may be beneficial, for example, for flattening a bowed objects, which may be achieved, by increasing the pressure at sector 404 in relation to the pressure of sector 402. Thus, the flatness of the top-surface of the object 310 (for example, a round wafer) may be increased as the object 310 is supported without contact by the fluid-cushion.

According to another exemplary embodiment of the invention, configuration 410 (FIG. 4b) may include a first sector 412 and a second elongated sector 414 to maintain an fluid cushion to support object 310 over the active surface 340. Configuration 410 may be implemented, for example, in conjunction with optical device 332 moving in a radial scanning motion along slot 415.

According to yet another exemplary embodiment of the invention configuration 420 (FIG. 4c), may include a plurality of annular sectors, e.g., sectors 422, 424, 426 and 428, each able to locally adjust the gap of a corresponding annular segment of the active surface 340.

According to yet another exemplary embodiment of the invention, configuration 430 (FIG. 4d), may include a plurality of radial sectors, e.g., sectors 431, 432, 433, 434, 435, 436, 437 and 438, each able to locally adjust the fluid cushion gap $\epsilon$ of a corresponding radial segment of the active surface 340. One or more of the radial sectors may be divided into one or more sub-sectors, e.g., in order to allow both radial and annular adjustment of the fluid cushion gap $\epsilon$. For example, sector 431 may be divided into sub-sectors 439a and 439b.

According to yet another exemplary embodiment of the invention, configuration 440 (FIG. 4e) may include a configuration similar to configuration 210 (FIG. 2a), e.g., including passive section 214 and/or one or more evacuation holes 216. Configuration 440 may include a plurality of radial perimeter-sectors, e.g., sectors 442, 443, 444, 445, 446, 447, 448 and 449. For example, one or more of sectors 441, 442, 443, 444, 445, 446, 447 and 448 may be implemented, for example to allow parallelism adjustment with respect to a reference plane (including virtual reference plane).

According to yet another exemplary embodiment of the invention, configuration 450 (FIG. 4f) may include a plurality of separated sectors, each corresponding to a predetermined segment of surface 340. One or more of the sectors may be able to maintain a, e.g., separate, fluid cushion over one or more corresponding segments of surface 340. The sectors may include sectors of any desired size and/or shape, e.g., a rectangular sector 456, circular sectors 452, 458 and 459, or any other polygonal sector, e.g., hexagonal sector 454. The intermediate areas between the separate sectors may be lower or aligned with the active surface 340.

It is very important to emphasize with respect to the present invention that by applying individual control by AM-means to each of the sector, in addition to the ability to adjust the distance from a local point at the top-surface of a substrate to, for example, an optical device, at the same time the local slope or the parallelism with respect a reference plane of that optical device can be controlled.

It is very important to emphasize with respect to the present invention that by applying the fluid-cushions having plurality of basic cells (see Reference-1), for non-contact platforms, a very uniform supporting fluid cushion of local nature is established without any global effect as the mass flow rate is substantially balanced within each basic cell (e.g. the platforms are of "local-balanced" nature). Accordingly, a very accurate and stable non-contact support of local nature is provided, for example, even for a wide format FPD thin glass of dimension that can be larger than 2×2 meters.

Figure 5:
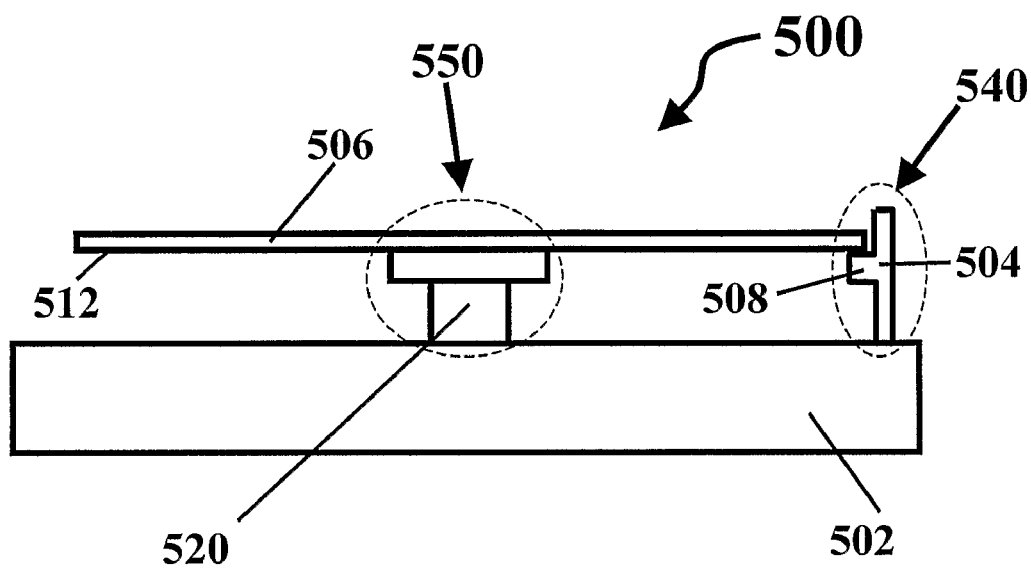

According to some exemplary embodiments of the invention, apparatus configurations 100 (FIG. 1), or 300 (FIG. 3), may include a "landing mechanism" for supporting the object during loading ("landing") and unloading sequences. Reference is now made to FIG. 5, which schematically illustrates a landing mechanism 500. Landing mechanism 500 may be associated with a non-contact support platform 502, e.g., as described above with reference to FIG. 1 or FIG. 3. Mechanism 500 may include, for example, three or more peripheral landing pins 504 having a protruding element 508. Landing pins 504 may be located along to a circumference of a round object 506 such as a wafer. Pins 504 may be adapted to limit possible vertical movements of object 506 with respect to platform 502, e.g., during loading and/or unloading, without generating any substantial lateral force on object 506. After landing, the object is supported by a fluid cushion generated by platform 502. When object 506 is supported by the fluid cushion, elements 508 may be retracted, for example, 1 mm below the top surface of platform 502.

Alternatively or additionally, landing mechanism 500 may include, for example, one or more bottom-side landing pins 520. Pins 520 may be located under object 506 to support its backside surface 512 during loading/unloading periods. At least some of pins 520 may include a vacuum pad (not shown), as are known in the art, to clamp object 506. In such cases, lateral position of the object may be maintained during the loading sequence.

It has to be emphasized that during loading and unloading periods the pressure level at the manifolds of 502 may be changed in order to (a) release AM clamping when the platform generate a PV-type fluid-cushion, for example, by significantly lowering the pressure level at the evacuation manifolds of 502, (b) elevate the object, for example, for example, by significantly lowering the pressure level at the evacuation manifolds of 502 and/or by increasing the pressure level at the supply manifolds of 502.

Another alternative for loading and unloading operations, according to some exemplary embodiments of the invention, may be provided by using a non-contact conveying platform adjoined to platform 502 where the object is transfer to 502 over that platform without contact (see FIG. 11).

According to embodiments of the invention, a non-contact apparatus, for example apparatus configurations 100 (FIG. 1) or 300 (FIG. 3), may implement any suitable gripping mechanism, e.g., as described below, able to allow vertical movements of the of the object, e.g., in a direction that is substantially perpendicular to the active-surface of the non-contact platform of the apparatus, while preventing any lateral movements of the object, e.g., in a plane that is substantially in parallel to that active-surface, to prevent any practical interference to the AM-mechanism of adjusting locally or globally the fluid cushion gap.

Reference is now made to FIG. 6*a*, which schematically illustrates a conceptual top-view of an edge-gripping apparatus configuration 600 according to an exemplary embodiment of the invention. Apparatus configuration 600 may include, for example, three aligning devices 602 located, for example at equal distances, along a circumference of an object 603 such as a wafer supported by a non-contact support platform 604, e.g., as described above with reference to FIG. 1 or FIG. 3. Devices 602 may be able to horizontally align object 603 with respect to the center of platform 604, and to substantially prevent relative lateral motion of object 603 with respect to platform 604, for example, during lateral motion (linear, planar or circular) of platform 604, wherein lateral accelerations may develop.

Devices 602 may be adapted to allow vertical movements of object 603, as described below, e.g., while not imposing significant vertical forces relative to the vertical forces imposed by the non-contact platform during the operational periods of adjusting the fluid cushion gap by AM-means. Reference is made to FIGS. 6*b* and 6*c*, which schematically illustrate a top view and a side-view, respectively, of a conceptual device 602 according to an exemplary embodiment of the invention.

Device 602 may include a horizontal positioning mechanism 620, e.g., a pusher, connected to a flexure 622, which may be connected to an idler wheel 624, e.g., by a bearing 626, in order to align object 603 in a desired horizontal centricity with respect to platform 604, and to substantially prevent lateral movements of object 603 with respect to platform 604, which may be laterally accelerated. Bearing 626 may allow rotation of idler 624 with respect to edge of object 603, and flexure 622 may allow vertical movements of idler 624, e.g., without generating significant vertical forces during fluid-cushion gap adjustment by AM-means. Device 602 may also include a limiter 628 able to prevent vertical down movement of flexure 622, e.g., beyond a predetermined vertical distance. Thus, device 602 may allow rotational and/or vertical movements of object 603 with respect to platform 604, and prevent lateral movements of object 603 with respect to platform 604.

Figure 7A:
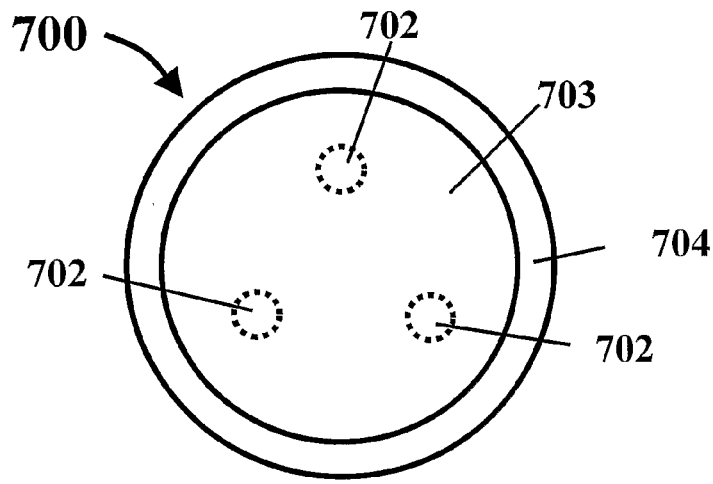

Reference is now made to FIG. 7*a*, which schematically illustrates a top-view of another conceptual backside-gripping apparatus configuration 700 according to an exemplary embodiment of the invention. Apparatus configuration 700 may include, for example, one or more gripping devices 702 located, e.g., in predefined locations, under an object 703 supported by a non-contact support platform 704, e.g., as described above with reference to FIG. 1 or FIG. 3. Devices 702 may be able to substantially prevent lateral movements of object 703 with respect to platform 704 which may be horizontally accelerated, and to allow vertical movements of object 703, e.g., without generating significant vertical forces during adjustment of the fluid cushion gap By AM-means as described below.

Figure 7B:
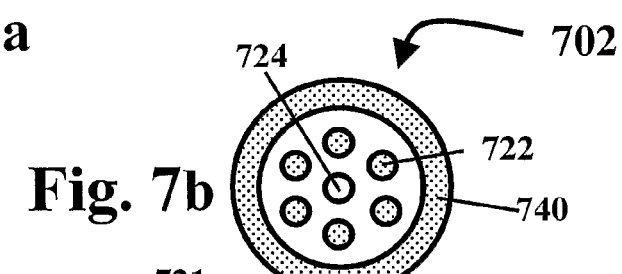
Figure 7C:
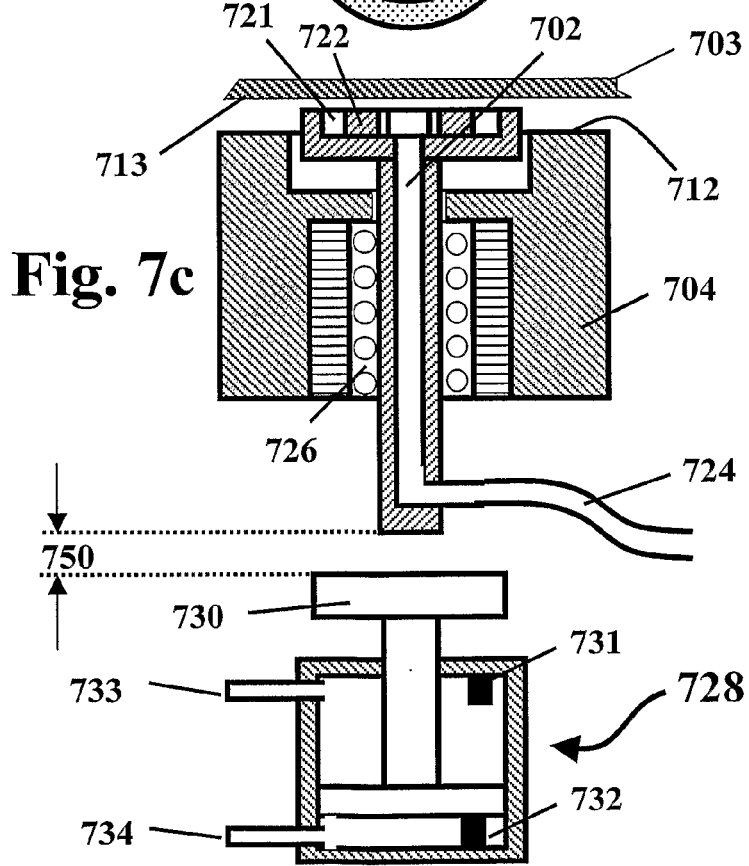

Reference is also made to FIGS. 7*b* and 7*c*, which schematically illustrate a top view and a side-view, respectively, of device 702. Device 702 may be inserted in a linear bearing device 726 which may be mounted inside platform 704. Bearing 726 may include a linear bearing, e.g., adapted to allow vertical movements of device 702, e.g., without generating significant vertical forces in a direction that is perpendicular to the active surface 712 of platform 704, and to prevent lateral movements of object 703 with respect to platform 704. Device 702 may grip object 703, for example, by providing vacuum to cavity 721 of device 702 via a pipe 724. Device 702 may also include one or more support pins 722 in order to substantially prevent local sinking of the gripped section of object 703 due to vacuum forces. A locking mechanism (not-shown) between platform 704 and device 702 may also be implemented. The locking mechanism may be based, for example, on a mechanical or aeromechanical locking mechanism as is known in the art.

According to some exemplary embodiments, bearing 726 may be an annular air-bearing device having lateral stiffness adapted to prevent lateral movements of object 703 with respect to platform 704.

According to some exemplary embodiments a landing mechanism 728 may be implemented in conjunction with device 702. Mechanism 728 may include a piston 730 limited by two vertical limiters, 731 and 732. Mechanism 728 may be located under device 702, such that piston 730 may be activated by pneumatic valves 733 and 734, to vertically move device 702 to a desired vertical positions, e.g., an "upper" position during loading or before unloading and a "lower" position after landing. A damper (not shown) to smooth the vertical motion may also be implemented.

According to some exemplary embodiments landing mechanism 728 may be implemented in conjunction with device 702 where after landing, the top surface of piston 730 may not touch device 702, e.g. a gap 750 may be formed as piston 730 moves further down. Accordingly, device 702 may be suspended by object 703 as it is clamped by vacuum. Therefore it is preferable to minimize the weight of device 702.

Figure 7D:
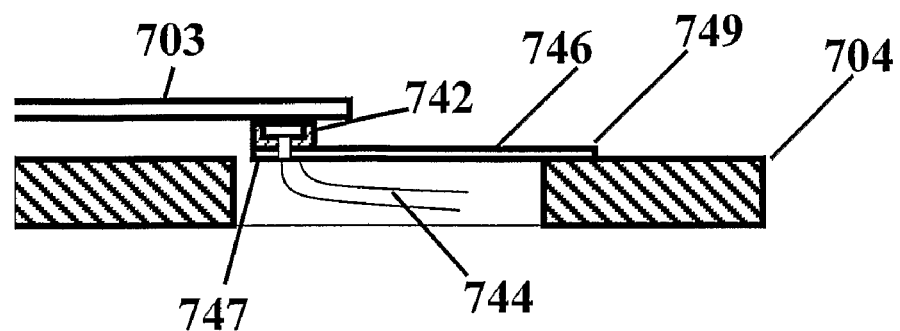
Figure 7E:
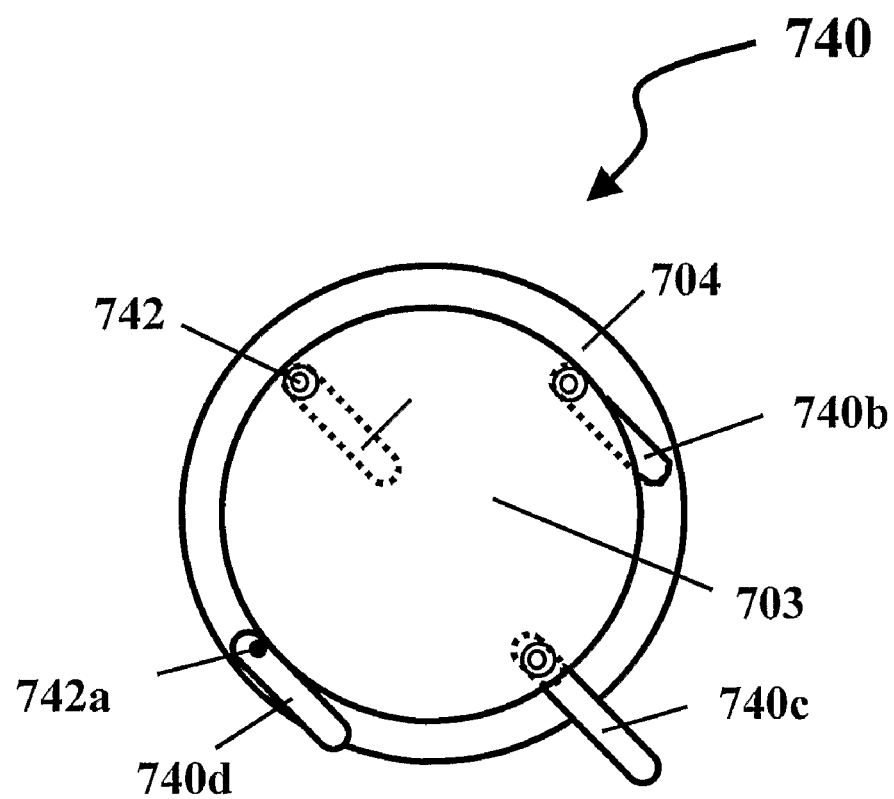

Reference is made to FIGS. 7d and 7e, which schematically illustrates a side-view of a conceptual backside-gripping apparatus configuration 740 according to another exemplary embodiment of the invention. Apparatus configuration 740 may include a gripping element 742 able to grip a section of object 703 such as a wafer. For example, element 742 may be able to grip object 703 by using vacuum, provided via a vacuum conduit 744. Element 742 may be attached to a first end 747 of a flexure 746. A second end 749 of flexure 746 may be attached to platform 704. FIG. 7e, schematically illustrates a top view of platform 704 including three gripping elements 740, attached to platform 704 in different locations and/or orientations with respect to platform 704. For example, flexure 746 may be tangentially or radialy oriented with respect to the perimeter of object 703. Flexure 746 may be located below or beside platform 704. This arrangement allow vertical movements of object 703, e.g., in a direction that is substantially perpendicular to the active-surface of the non-contact platform 704, while preventing any lateral movements of object 703, e.g., in a plane that is substantially in parallel to that active-surface, to prevent any practical interference to the AM-mechanism of adjusting locally or globally the fluid cushion gap.

According to embodiments of the invention, a non-contact apparatus, e.g., as described above, may contain any suitable rotational or lateral motion mechanism, e.g., as described below, to position the object in relation to the optical device, for example, as part of a scanning process of the surface of the object by the optical device. Gripping elements, landing mechanism and align mechanism, e.g., as described above, may be implemented A scanning motion may be implemented, for example, by rotating the platform or by laterally moves platform, e.g., as described below.

Figure 8A:
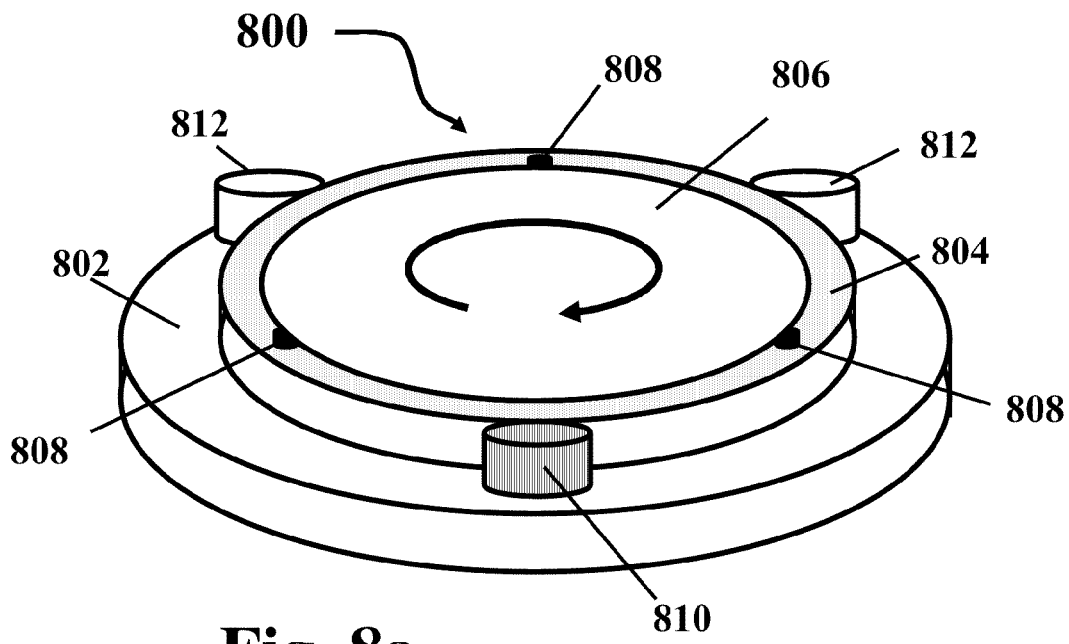
FIGS. 8a-c is a schematic illustration of a several rotation mechanism associated with non-contact supporting platforms.

Reference is made to FIG. 8a, which schematically illustrates a non-contact rotating platform apparatus configuration 800 according to an exemplary embodiment of the invention. Apparatus configuration 800 may include a stationary base 802, for example a granite table as is known in the art and non-contact platform 804, e.g., as described above with reference to FIG. 1 or FIG. 3, to supports an object 806 such as a wafer without contact. Platform 804 may be supported above the surface of base 802 using any support mechanism known in the art, e.g., a platform supported by air bearings or mechanical bearings or a fluid-cushion supporting platform, e.g., as described in reference 1. Object 806 may be laterally gripped by a gripping mechanism 808 attached to platform 804. Apparatus configuration 800 may also include a rotation mechanism able to rotate platform 804 with respect to base 802, as it supports object 806 without contact. For example, apparatus configuration 800 may include a drive wheel 810 and two or more idler wheels 812 connected to base 802 and in contact with a perimeter of platform 804. Platform 804 may be rotated by drive wheel 810, using a motor (not shown). According to some embodiments, at least two of wheels 812 and 810 may be moved laterally (typically movements of few millimeters) with respect to platform 802, in order to align object 806 at a desired position relative to platform 802, for example, to "center" object 806 relative to platform 802. Wheel 810 can also align the angular positioning of object 806 at a desired position relative to platform 802, for example, for finding the notch of a wafer ("Notch finder" as is known in the art).

Figure 8B:
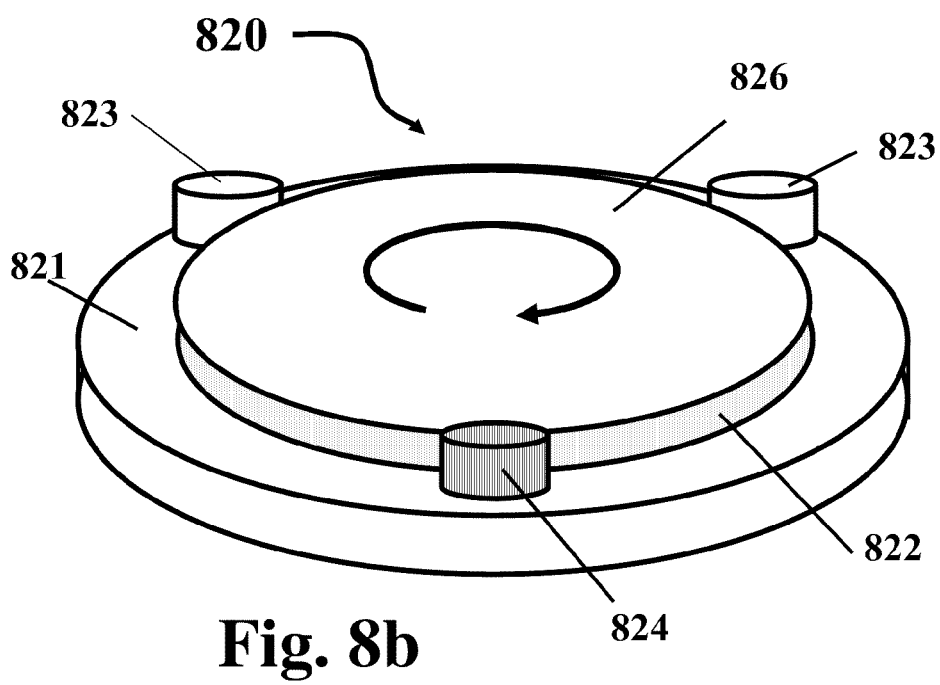

Reference is made to FIG. 8b, which schematically illustrates a non-contact rotating apparatus configuration 820 according to another exemplary embodiment of the invention. Apparatus configuration 820 is similar in many details to apparatus configuration 800. It has a base 821 and a non-contact platform 822 that solidly connected to base 821. The object 826 is held laterally by elements 823 and 824, in similar to apparatus configuration 820. Essentially, object 826 may rotated by drive wheel 824 that touches the edges of 826, where object 826 is supported without contact by a stationary platform 822 (in apparatus configuration 800, both the object and the platform are rotating).

Figure 8C:
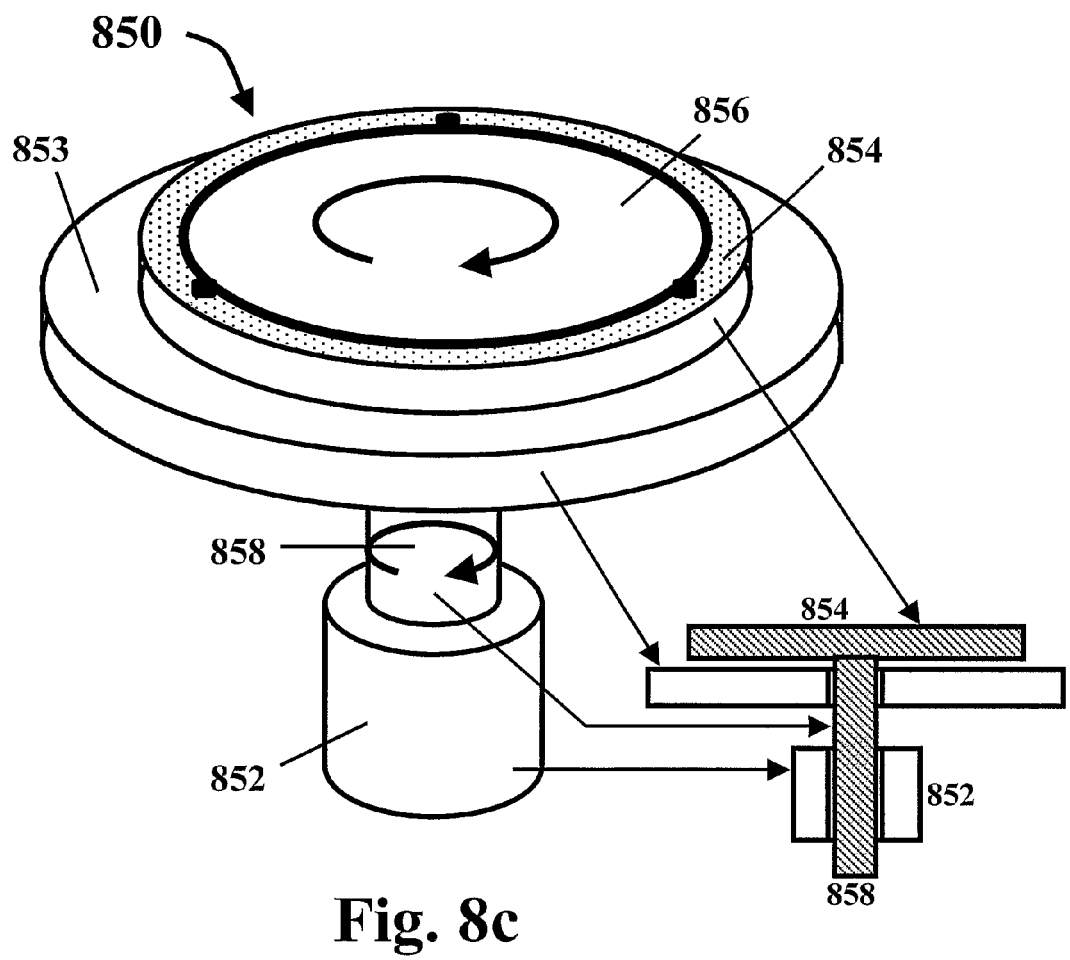

Reference is made to FIG. 8c, which schematically illustrates a non-contact rotating apparatus configuration 850 according to another exemplary embodiment of the invention. Apparatus configuration 850 may include a motor 852 able to rotate, e.g., via a shaft 858, a non-contact platform 854 supporting object 856. The platform is supported by base 853 in details similar to apparatus configuration 800.

However, apparatus configuration 850 may illustrates, according to another exemplary embodiment of the invention, another option of implementing adjustment by AM-means; Base 853 may be itself a non-contact platform that support platform 854 in a fluid cushion gap that can be manipulated by AM-means. In that case, platform 854 may hold the object 856, for example with contact, and rotating together with object 854 (in apparatus configuration 800, both the object and the platform are rotating, but adjustment by AM-means is applied on the fluid cushion gap between the active surface of platform 804 and the facing backside surface of object 806).

Reference is made to FIG. 8d, which schematically illustrates a general view and a cross-sectional view of a rotating apparatus configuration 860 according to yet another exemplary embodiment of the invention. Apparatus configuration 860 may include a peripheral gripping ring 862 able to grip an object 868 such as a wafer, by using edge gripping elements 864, for example, object 868 can be gripped by flexible edge gripping elements as previously described, adapted not to impose vertical forces on object 868, and to prevent lateral movements of object 868 with respect to ring 862. Both Ring 862 and object 868 may be supported without contact by a non-contact platform 866, and being rotated by drive wheel 865. Accordingly, gripping ring 862 must be flat and of relatively wide facing down surface in order to establish an effective high-performance supporting fluid cushion. Two or more idler wheels (not shown) may be added in similar to the above description referring to FIG. 8a.

Figure 9A:
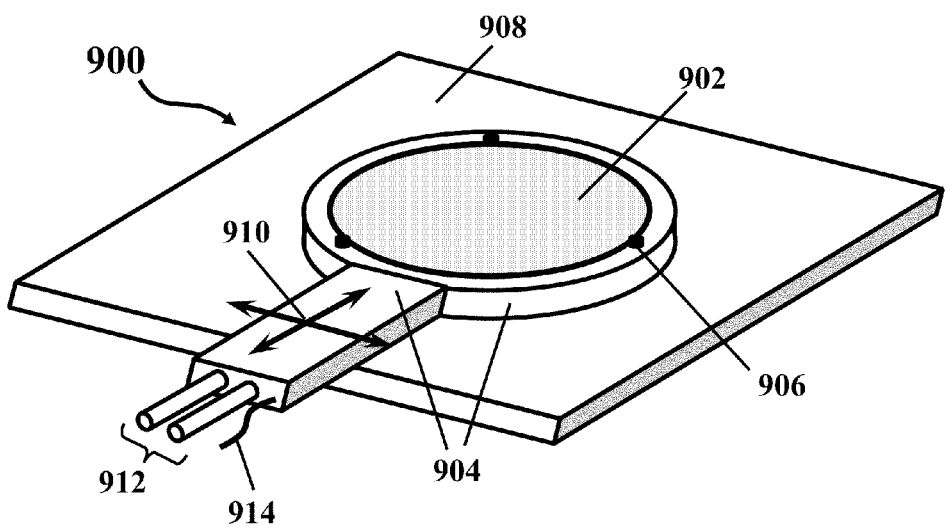
FIGS. 9a-b schematically illustrate apparatuses with planner motion associated with non-contact supporting platforms.

Reference is made to FIG. 9a, which schematically illustrates, lateral-positioning apparatus configuration 900 according to an exemplary embodiment of the invention. Apparatus configuration 900 may include a support base 908 having flat surface, e.g., a granite table as is known in the art, and a traveling non-contact platform 904, connected to a controllable planer (XY) motion system symbolically denoted by arrows 910. Platform 904 holds with contact object 902, for example by using gripping elements 906, or alternatively by applying holding down vacuum forces. Two main pipelines 912 (the main supply and evacuation pipelines, see FIG. 1) are fluidically connected to platform 904 for generating the fluid-cushion. Apparatus configuration 900 may also include one or more control channels 914 for controlling the gripping e.g., by gripper 906. Platform 904 has a facing down active surface thus a fluid cushion is created between the active surface of platform 904 and the flat surface of the supporting base 908. It has to be emphasized that in this case fluid cushion gap control is provided by AM-means applied on the fluid cushion created below platform 904. Platform 904 may be laterally poisoned or being traveled in lateral motion in a plane parallel to surface 908, e, g., by using motion system 910.

Figure 9B:
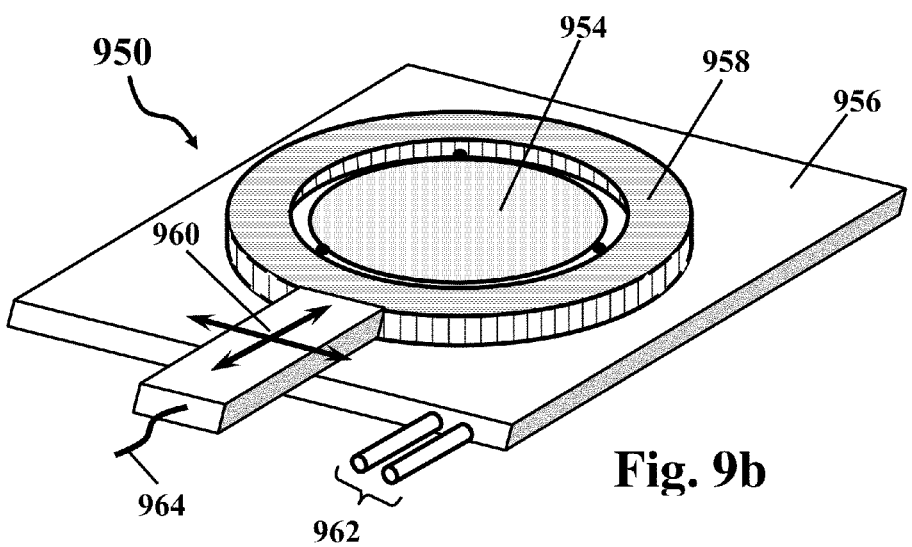

Reference is made to FIG. 9b, which schematically illustrates a lateral-positioning apparatus configuration 950 according to another exemplary embodiment of the invention. Apparatus configuration 950 may include a peripheral gripping ring 958 able to grip an object 954 such as a wafer, e.g., as described above with reference to FIG. 8d. Control channels 964 implemented for controlling gripping ring 958. Apparatus configuration 950 also includes a non-contact supporting platform 956, e.g., as described above with reference to FIG. 1 or FIG. 3. Two or more main pipelines 962 (the main supply and evacuation pipelines), are fluidically connected to platform 964 for generating the fluid-cushion at the top surface of 964. Platform 956 may be able to simultaneously support without contact the gripping ring 958 and object 954 gripped by 958. Apparatus configuration 950 may also include a motion system 960, e.g., analogous to the motion system described above with reference to FIG. 9a, able to move ring 958, e.g., in a planer motion above the top surface of platform 956.

Although some embodiments of the invention described above refer to an object having a round shape, it will be appreciated by those skilled in the art that the apparatus and/or methods, according to embodiments of the invention, may be analogously implemented for objects having any other shape, e.g., a rectangular shape, or size. For example, SC masks for the photolithography process or wide format AM platforms for supporting Flat Panel Displays (FPD) during processes such as inspection, photolithography or any other manufacturing process, as described below.

Figure 10A:
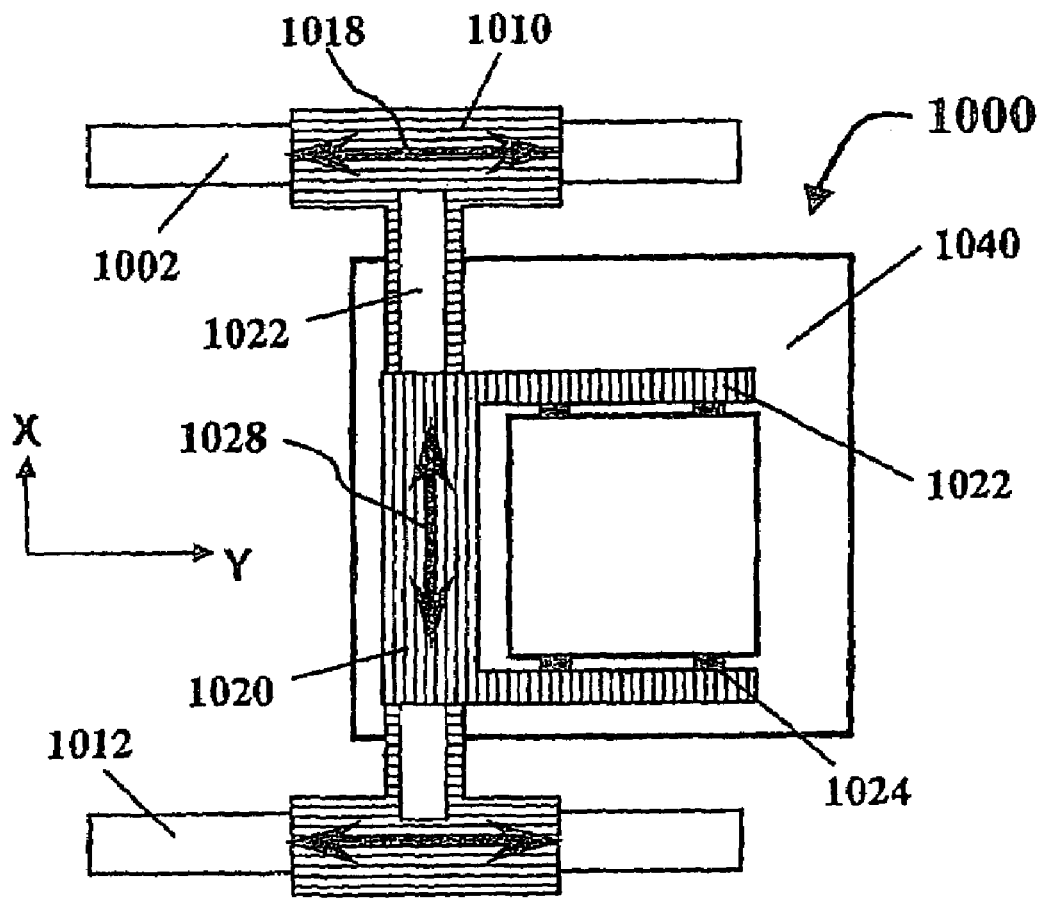
FIGS. 10a-b schematically illustrate a apparatus with planer motion associated with non-contact supporting platforms.

Reference is made to FIG. 10a, which schematically illustrates a lateral (XY) positioning apparatus configuration 1000 according to yet another exemplary embodiment of the invention. Apparatus configuration 1000 my include a first, e.g., an "X-linear", motion system 1028, and a second, e.g., an "Y-linear", motion system 1018. Motion system 1018 drives carriages 1010 able to move along Y-sliders 1002 and 1012, and motion system 1028 may drive a central carriage 1020 able to move along a X-slider 1022 supported from its both sides by 1010. Motion systems 1018 and 1028 together create "XY-motion system" of apparatus configuration 1000. Carriage 1020 may include a gripper 1022, having controllable gripping elements 1024 able to grip a rectangular object 1030, for example such as a mask for the SC photolithography process. Object 1030 is supported without contact by a platform 1040. Platform 1040 is capable to locally or globally adjust the fluid cushion gap. Object 1030 may be moved laterally e.g., by motion systems 1018 and 1028, while being supported without contact by platform 1040. Optionally, platform 1040 may support, at least partly, the weight of the X-slider 1022, and for that, the facing down surface of 1022 must be flat and wide enough to create accurated and stable supporting fluid cushion below 1022. It has to be emphasized that when using a fluid cushion having very large aeromechanical stiffness (see Reference 1) such as the clamping vacuum preload fluid-cushion, the overall functional stiffness of X-slider 1022 will be a combination of the mechanical rigidity of the X-slider 1022 itself and the additional stiffness provided by the fluid-cushion that support or clamp X-slider 1022.

Figure 10B:
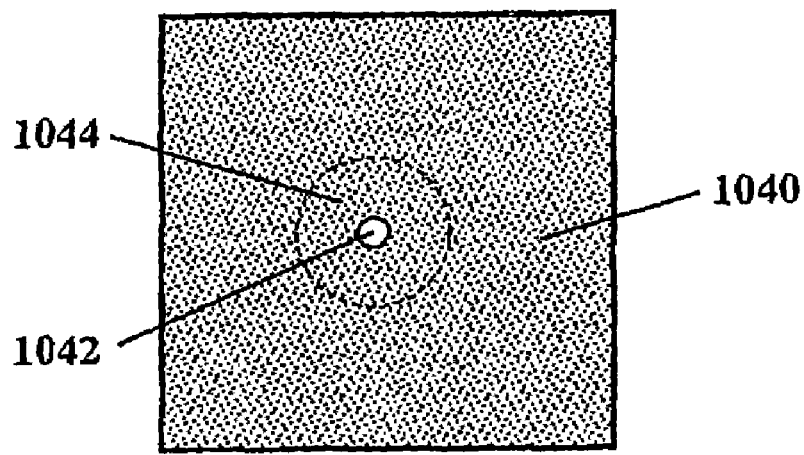

Reference is also made to FIG. 10b, which schematically illustrates a top-view of the active surface of platform 1040, platform 1040 my include an aperture 1042, e.g., adapted to provide backside illumination of mask 1030. This configuration may allow performing any desired additional process to the backside of mask 1030. Platform 1040 may include a central sector 1044, e.g., adapted to provide local fluid cushion gap adjustment by AM-means. Alternatively, global fluid cushion gap adjustment may be provided by controlling the entire active surface of 1040. In both cases, the central sector may be associated as a "stationary process zone", for example, an inspection zone below a stationary optical device of a SC inspection system, where any point on object may be positioned very accurately (for example, within few nanometers), at the center of sector 1044 by the XY motion system of apparatus configuration 1000.

Without derogating the generality, some embodiments of the invention described above refer to generally wide objects, e.g., rectangular FPD panels having large typical dimensions, for example, 1.8 meters by 2.3 meters "Generation-7" FPD size, or 2.3 meters by 2.6 meters "Generation-8" FPD size, as described below.

Reference is now made to FIGS. 11a-11d, which schematically illustrate four apparatus configurations 1101, 1102, 1103 and 1104, respectively, which may be implemented for positioning, a relatively large substrate, e.g., an FPD panel, according to exemplary embodiments of the invention. It will be appreciated by those skilled in the art that the apparatus configurations of FIGS. 11a-d are not limited to FPD applications, and may be implemented in accordance with other embodiments of the invention for positioning any other wide format substrate, e.g., Printed Circuit Board (PCB) or hard-media substrates such as printing plate. In many cases, the fluid-cushion will be an air cushion.

Reference is now made to FIG. 11a. According to exemplary embodiments of the invention, apparatus configuration 1101 may include a wide non-contact support platform 1112, e.g., as described above, to support a substantial thin large format panel 1110 such as FPD. In most of the active surface of platform 1112 accuracy is not needed, only safe non-contact support (meaning to guarantee non-contact), thus a PA-type fluid-cushion may by applied (see Reference-1) for the inaccurate regions. However, at least a section, e.g., an elongated central section 1114 of platform 1112, may include a very accurate and stable zone wherein a PV-type fluid-cushion may apply, e.g., as described above (see also Reference-1), to be referred to as the "elongated process zone" (similar to the description given with respect to FIG. 10b). In many cases, a process tool may be position above section 1114, preferably applies a process substantially at the centerline of section 1114. Apparatus configuration 1101 may include a linear drive system 1122 for conveying panel 1110. Gripping elements 1126, 1128 (mechanical or vacuum grippers), may be used to clamp panel 1110 at its edges (e.g. the trailing edge and the leading edge), connected to drive system 1122 via one or more slots 1124 formed in platform 1112, however, panel 1110 may be conveyed along platform 1112 by gripping only one edge of panel 1110. Panel 1110 may be conveyed forwards and/or backwards very accurately (for example few micrometers), in a direction as indicated by arrow 1120. Accordingly, each point of the top surface of panel 1110 may be positioned at the centerline of the elongated process zone (section 1114). It has to be emphasized, with respect apparatus configuration 1101 (and it is true also with respect to apparatus configurations 1102-1104), that fluid-cushion gap adjustment by AM-means is applied at the central sector 1114. Gap adjustment may be apply (a) for pre-calibration adjustment (b) during executing a process.

Reference is now made to FIG. 11b. According to another exemplary embodiments of the invention, apparatus configuration 1102 may include a non-contact support platform 1132 similar to platform 1112 in most details. e.g., as described above, able to support a panel 1130 without contact. At least one accurate section 1124 (meaning that in some cases more than one will be provided to reduce overall footprint of the platform), e.g., the central elongated process zone of platform 1132 may be provided, wherein a PV-type fluid-cushion is applied. Apparatus configuration 1102 may include a drive system 1144 for conveying panel 1130. Panel 1130 may be conveyed in parallel to an X-axis, e.g., forwards and/or backwards in a direction indicated by arrow 1140. System 1144 may also include at least one side-gripper 1142 to clamp at least one side-edge of panel 1130.

According to exemplary embodiments of the invention, the active surface of section 1134 may be divided to several parallel sectors 1136 along Y-axes, in order to enable fluid-cushion gap adjustment of local manner by AM-means, for example, with respect to a reference substantially straight line of a process tool. Moreover, if each of sectors 1136 is further divided into two sub-sectors with respect to X-axes, e.g. before and after the centerline of section 1143, fluid-cushion gap adjustment of local manner by AM-means may be applied for parallelism enhancement, for example, of the facing section of panel 1130 with respect to a reference substantially flat plane of a process tool.

Figure 11C:
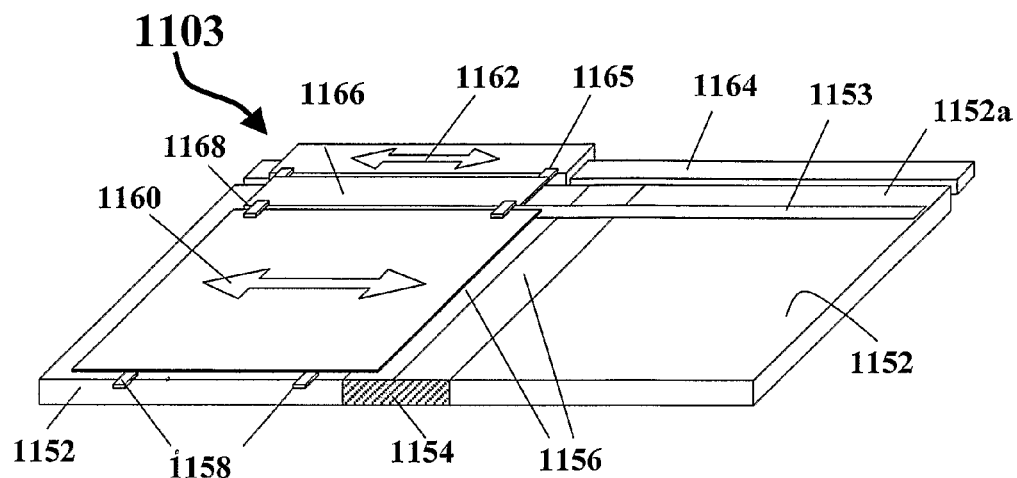

Reference is now made to FIG. 11c. According to yet another exemplary embodiments of the invention, apparatus configuration 1103 may include a non-contact support platform 1152, able to support a panel 1150, provided with accurate central zone 1154 as described above. Apparatus configuration 1103 may include a drive system 1164 for conveying panel 1150 forwards and/or backwards in a direction indicated by arrow 1160. Apparatus configuration 1103 may include a floating side-gripper 1166 for clamping panel 1150. Side-gripper may include at least one mechanical gripping element 1168 for gripping an edge of panel 1150 (vacuum gripping elements may alternatively be used). Element 1168 may be partially inserted in a slot 1153, e.g., such that the motion of element 1168 is confined along slot 1153. Gripper 1166 may be relatively wide, e.g., with respect to the dimensions of the basic cell of the PV-type supporting surface 1152a, in order to generate an effective fluid-cushion support. Gripper 1166 may be formed of a flexible structure having a lower mechanical stiffness related to the aeromechanical stiffness of the PV-type fluid-cushion thus it will follow the top-surface of platform 1152. Gripper 1166 may be connected, e.g., via connectors 1165, to a carriage 1162 that is driven along the X-axis, i.e. traveling along a slider 1164 by a linear drive system. For Y-axis pre-align or registration purposes, platform 1152 may be equipped with one or more accurate pushing aligning-elements 1158 that may push the side edges of panel 1150 against reference pins or alternatively by using additional side-elements at the opposite edge (both opposite elements are not shown in the figure). Pushing aligning-elements 1158 may be designed in such a way that only a limited side-force will be applied to panel 1150, for example by using springs or flexures. Apparatus configuration 1103 also aimed to allow fluid-cushion gap adjustment. For more details see the relevant description with respect to FIGS. 11a and 11b.

Figure 11D:
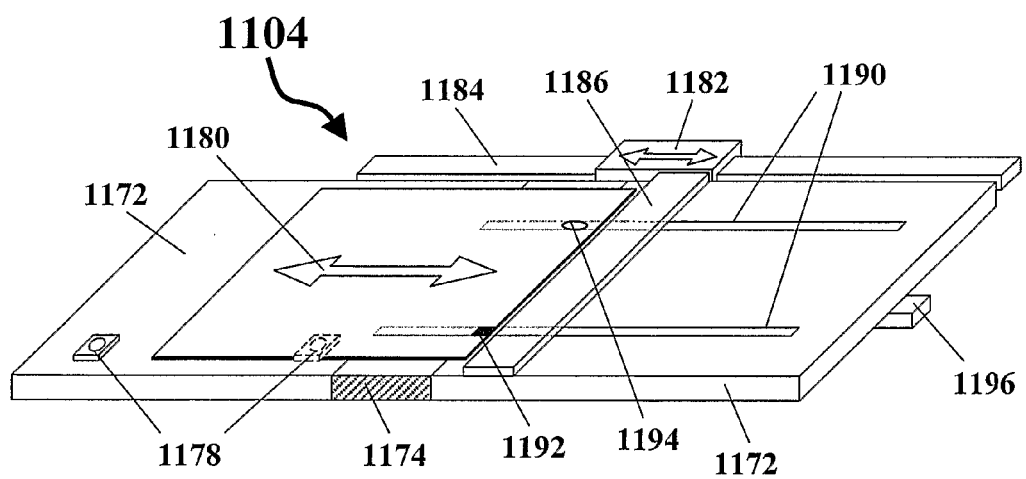

Reference is now made to FIG. 11d. According to yet another exemplary embodiments of the invention, apparatus configuration 1104 may include a non-contact support platform 1172, able to support a panel 1170, provided with accurate central zone 1174 as described above. Panel 1170 is traveling along the X-direction forwards and/or backwards as indicated by arrow 1180, gripped by a floating leading-edge gripper 1186 that drives the panel. Gripper 1186 is a wide gripper with respect to the dimensions of the basic cell of the PV-type supporting surface 1152a, in order to generate an effective fluid-cushion support, when it is supported at least partly by section 1174. Accordingly, gripper 1186 may be formed of a generally flexible (meaning relatively thin) and low-weight structure where it's functional (effective) stiffness may be significantly related to the aeromechanical stiffness of the PV-type fluid-cushion of 1174 when it is supported at least partly by section 1174. The floating leading edge gripper 1186 is driven along X-direction by carriage 1182 traveling over slider 1184. Alternatively, a linear motion system may be applied at the bottom side of platform 1172 where the floating gripper 1186 is connected through slots 1190 to a bottom-side linear motion system 1196. Apparatus configuration 1104 also aimed to allow fluid-cushion gap adjustment. For more details see the relevant description with respect to FIGS. 11a and 11b.

Figure 12A:
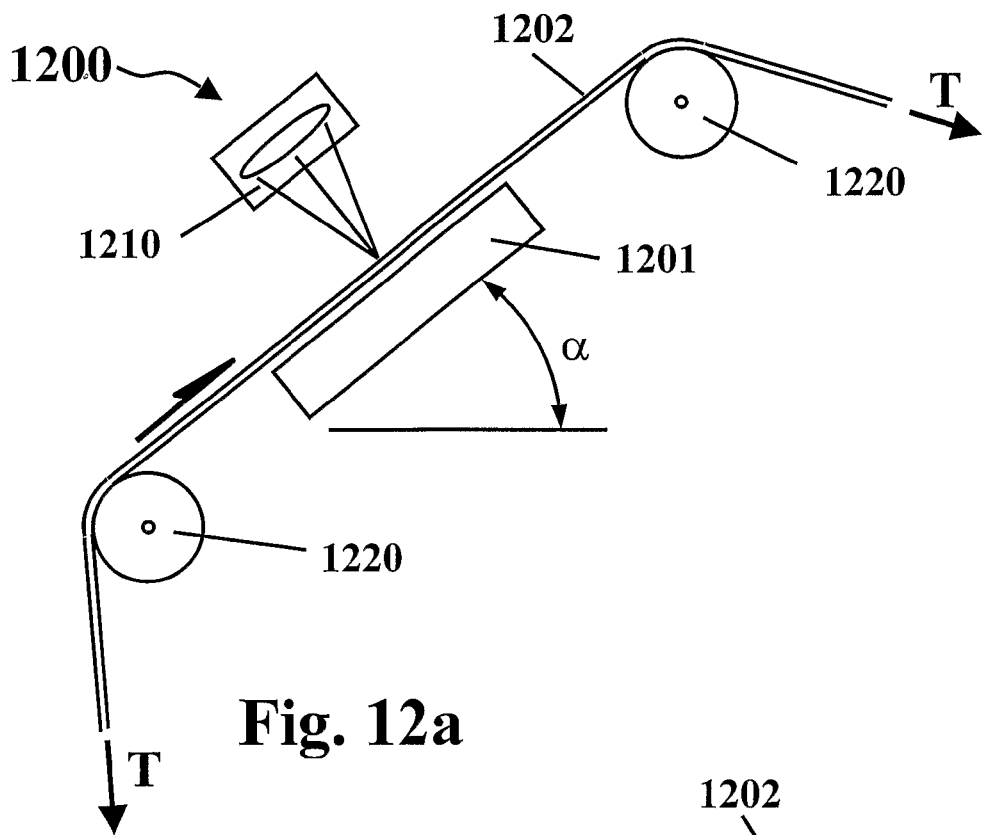
FIGS. 12a-12b are schematic illustrations of a non-contact platform associated with flexible media.

FIG. 12a Illustrates, according to exemplary embodiments of the present invention, an apparatus (1200) for providing AM distance adjustment for roll to roll applications such as flexible media for panel displays (OLED as known in the art), paper or cardboard, plastic media and materials or any other substantially flat and flexible object (to be refer to as a flexible media 1202), where a process is executed on its pacing surface and accuracy control or pre-calibration is needed in a global or local manner for establishing a well functioning process. Such an apparatus configuration may be useful for executing a manufacturing or repairing process machines as well as for inspection and testing systems. Apparatus configuration 1200 has a non-contact PV-type or PA-type platform 1201 for clamping or supporting the flexible media 1202. The media and platform 1201, having at least one sector, can be oriented at any angle α, where α can be 0-180 degrees with respect to horizontal plane (e.g. including upside-down situation). A facing process tool, for example an optical device 1202, is positioned substantially normal to the media 1202. The flexible media 1202 is transferred from the feeding roller to the collecting roller (not shown in the figure), where media transfer may be redirected by rotating guiding cylinders 1220 that touches the media from its backside surface. The media in most cases is maintained in tension (preferably uniform and stable with respect to time), between the feeding and the colleting rollers (as denoted by the letters T). The mission of platform 1201 of apparatus configuration 1200 is to adjust, locally or globally, the distance between the facing surface of media 1022 to device 1210.

Figure 12B:
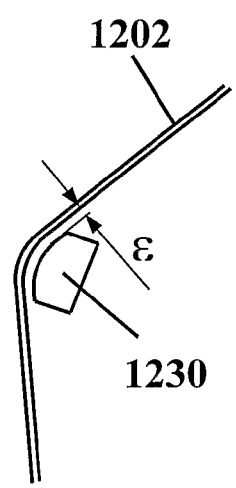

As the tension of media 1202 may affect by the guiding cylinder 1220, it is an option to integrate non-contact cylindrical guiding plates 1230 as shown in FIG. 12b. Such guiding plates are in fact additional non-contact platforms (PA or PV type—see Reference 1). The non-contact cylindrical guiding plates 1230 are stationary and do not affect the media tension.

However, it must be emphasized, (with respect to general objects, not only for flexible media), that in some cases the non-contact platform 1201, (capable to adjust locally or globally the gap of the fluid cushion or the distance or parallelism with respect to a reference element or a virtual reference), may have service holes (not shown), to allow executing a process on the media surface that also facing the platform. In addition, process tools or tools to assist the process (for example, illumination, cleaning, heating or optical inspection system), can be applied on the surface that facing the platform. Moreover, when non-contact guiding cylinder or any other non-contact support and non-contact platform are both applied, it become possible to execute a process on the backside or the frontside of the object where the frontside is facing the platform 1201 (frontside, for example, is the side where the microelectronics patterns exist, thus it is not allowed to impose any contact what so ever. In addition it is mostly important that in some cases the platform 1201 itself is capable to execute a process, while the gap between the platform and the object is locally or globally adjusted. Some examples for such cases are heating, cooling, drying, cleaning or fluid treatment in general, including use of chemicals.

Figure 13A:
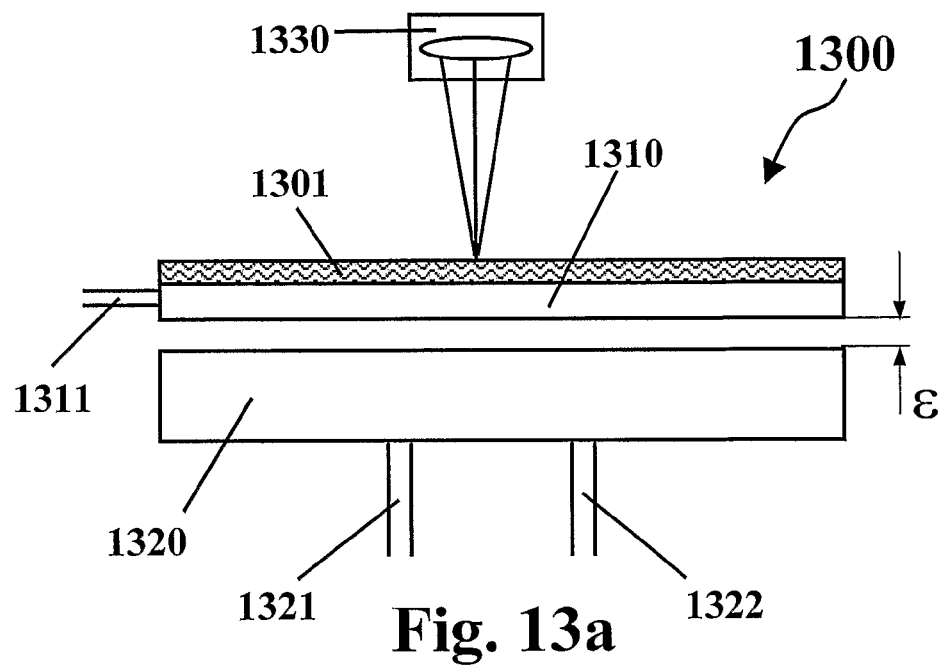
FIGS. 13a-b are a schematic illustrations of a non-contact supporting platform that has intermediate plate to support an object.

FIG. 13*a* Illustrates, according to another exemplary embodiments of the present invention, an apparatus (1300) for providing local or global AM distance and/or parallelism adjustment with respect to reference element (such the optical device 1330), or to provide local or global flatness control of the media itself. The apparatus 1300 comprising a non-contact supporting platform 1320 fed with pressurized fluid through at least one pipe 1231 of at least one sector of 1320, and fluid is evacuated through at least one pipe 1232 at least one sector of 1320, thus platform 1320 creating a PA-type non-contact supporting fluid-cushion. Pipe (or pipes) 1232 can be connected to a vacuum source, thus platform 1320 creating a PV-type non-contact clamping fluid-cushion. The number of pipes is correlated to the number of sectors of platform 1320. At-least one pressure control valve (not shown) is interposed with at least one pipe 1231 or pipe 1232. Platform 1320 supports an intermediate plate 1310 to holds or supports object 1301 with contact. Holding may be provided, for example, by using electrostatic chucking, or, as shown in FIG. 13*a*, by applying vacuum holding down forces, where pipe 1311 is connected to a vacuum source. It is clear that when the intermediate plate 1310 holds the object 1301, the overall mechanical stiffness or the rigidity of the two connected elements (meaning plate 1310 and object 1301) may increased significantly/ In particular, it is very important in cases where the object 1301 is very thin (for example, 50 micrometer silicon wafer). It has to be emphasized that although a reference element 1330 is illustrated in FIG. 13*a*, in many other operational modes such a reference will be only a virtual reference. Such modes include manipulating of the flatness of the object, for creating desired curvature of a facing surface of object 1301 or for enhancement the flatness of a facing surface of object 1301, or for controlling the forces, or the uniformity of the forces applied on the object.

Figure 13B:
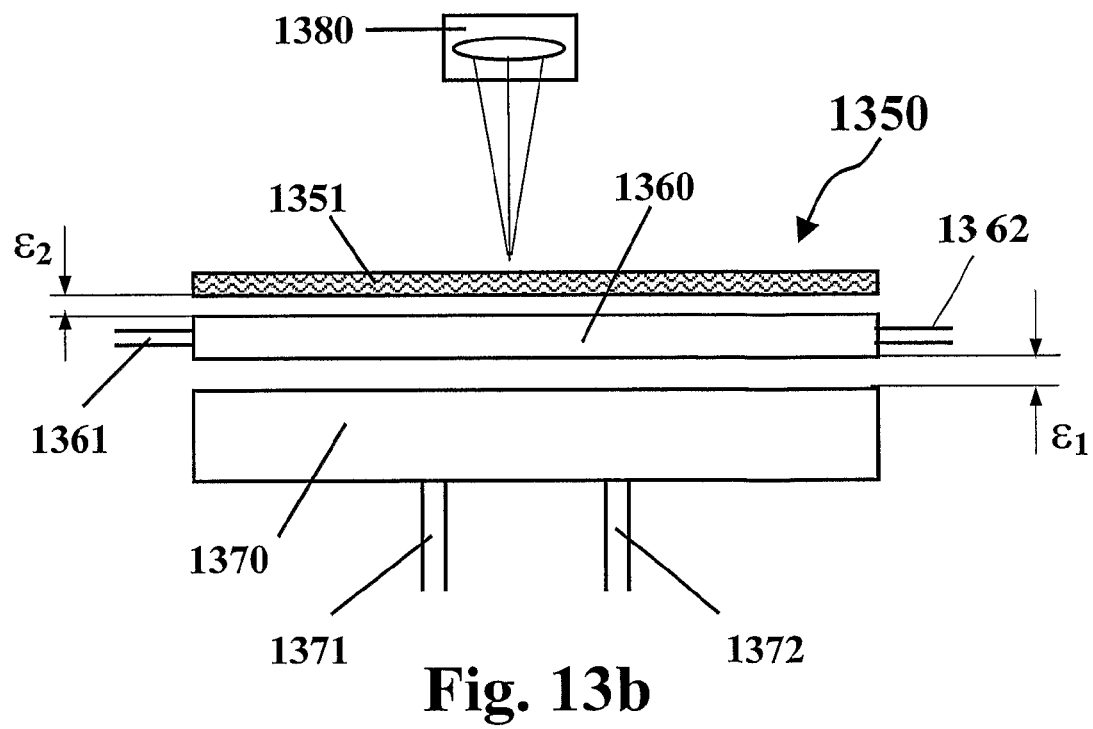

FIG. 13*b* illustrates, according to another exemplary embodiments of the present invention, an apparatus configuration (1350), which is very similar to 1300, but in addition, the intermediate plate 1350 itself is non-contact platform capable to support or to clamp object 1351 without contact (at a gap $\epsilon_2$) as it is supported by non-contact platform 1370 (at a gap $\epsilon_1$, controlled locally or globally by AM-means). Pressurized fluid is provided through pipe 1361 to create PA-type fluid-cushion for supporting object 1351 without contact. When connecting the evacuation pipe 1362 to a sub-atmospheric source, a PV-type fluid-cushion for clamping object 1351 without contact is created. In addition, it is an option to switch from non-contact supporting to in-contact holding by manipulating the pressure (for example by switching from pressurized air-supply to vacuum suction).

Figure 14A:
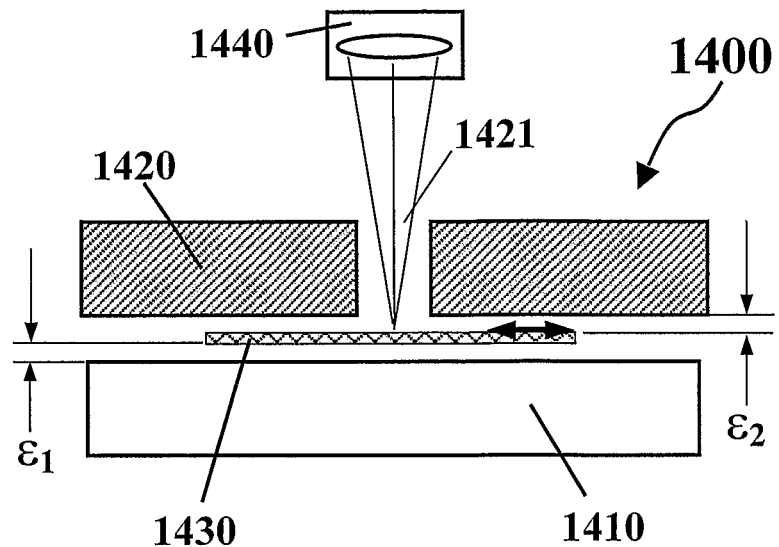
FIGS. 14a-b are a schematic illustrations of a dual side non-contact supporting platform that holds an object.

FIG. 14*a* illustrates, according to another exemplary embodiments of the present invention, a dual side apparatus configuration (1400), where first non-contact platform 1410 is facing a second opposing non-contact platform 1420. The platform 1410 and 1420 are substantially parallel to each other facing each other at a mirror symmetry. In most case these platforms are identical and has similar sectors facing each other. The object 1430, being stationary or traveling, is held without contact from its both sides, at an fluid cushion gap $\epsilon_1$ from 1410 and at an fluid cushion gap $\epsilon_2$ from 1420. Accordingly, the setup distance between the two opposing platform will be determined by the nominal thickness of object 1430 $\epsilon_1+\epsilon_2$. In some cases additional decoupling distance will be added in order to enable decoupling the dominancy of the platform, meaning for example that practically only the upper platform (1420) will clamp the object by PV-type fluid-cushion thus it becomes dominant with respect to AM-adjusting means, and the second platform below it (1410) will serve for loading/unloading and for safety reasons. Openings such as 1421 may be created in 1420 (or on both platforms), to allow facilitating access or to view the facing surface object 1430, as illustrated in FIG. 14*a* (optical device 1440 scan the top surface of object 1430). In some cases, a process zone (1411), not active in an aero-mechanical manner will be provided, in order to avoid local bending forces on object 1430

Figure 14B:
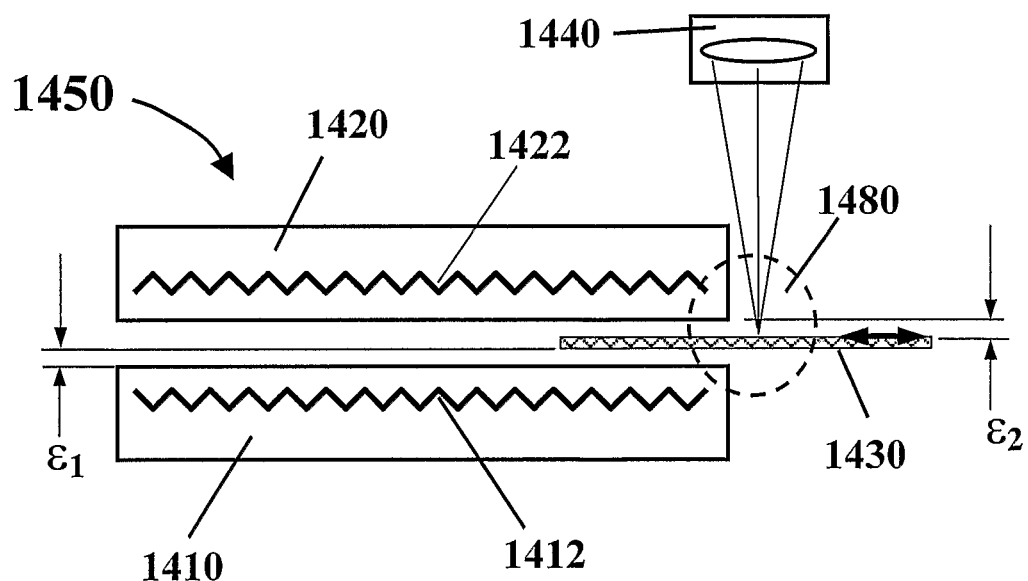

FIG. 14*b* illustrates a dual-sided non-contact apparatus configuration 1450 similar to configuration 1400 shown in FIG. 14*a*. In addition platforms 1410 and/or 1420 may includes heater (1412 and 1422). FIG. 14*b* also illustrate the possibility to locate a process tool (such as optical device 1440), at the exit area 1480 of apparatus configuration 1450.

It has to be emphasized that in some cases, these platforms my not be similar in several manners. For example (without derogating the generality), One platform can be larger than the second one.

At least one of the two platforms can generate a PA-type fluid-cushion (and if both—a PP-type dual side apparatus configuration is created).

At least one of the two platforms can generate a PV-type fluid-cushion (and if both—a PV-PV-type dual side apparatus configuration is created)

One or both platforms can have an active surfaces divided to sectors, or only one is divided to sectors, or both of the platforms do not have sectors.

In some cases the sectors of platform 1420 and 1410 are not identical.

In some cases at least one sector of same active surface will be provided with different type of fluid-cushion with respect to the fluid-cushion applied at the other sectors In some cases only at least one sector of either of the platforms will be controlled by AM-means and in some other cases at least one sector of both platforms will be controlled by AM-means.

In some cases both $\epsilon_1$ and $\epsilon_2$ will be manipulated globally or locally by AM-means, and in some other cases either $\epsilon_1$ or $\epsilon_2$ will be manipulated globally or locally by AM-means.

In some cases, the pressure levels (including the sub atmospheric pressure level) supplied to the sectors of each platform will be different from pressure levels supplied to the second platform.

In some cases, pressure level will be changed during operational sequence in order to switch dominancy between the two platforms.

Figure 15:
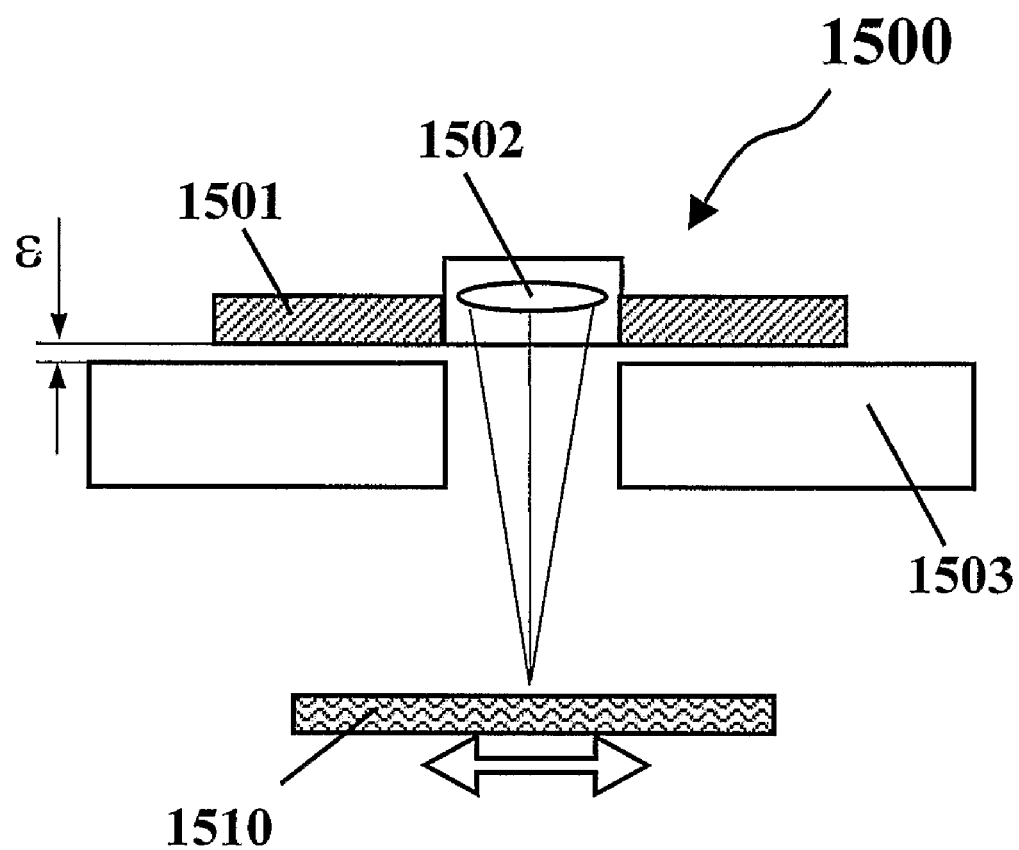
FIG. 15 is a schematic illustration of a non-contact supporting platform that holds an optical device.

FIG. 15 illustrates, according to another exemplary embodiments of the present invention, an apparatus 1500 for allowing optical focusing by AM-means. Holder 1501, optimally of low weight, holds an optical device 1502. The holder has substantially thin flat facing down surface and it is supported by a PV-type fluid-cushion generated by the facing up active surface of a non-contact platform 1503 having rigid and stable support. Platform 1503 has an opening to allow viewing of the top surface of item 1510. The active surface of platform 1503 is divided to several sectors, see for example FIG. 4e, to allow focusing of the distance between the optical device 1502 to a point at the top surface of item 1510, and in addition, to be able to adjust in local or global manner the parallelism between a reference plane of 1502 (normal to the view direction) and the top surface of item 1510. In general, not only optical device can be applied, but any other useful device, and in some cases it is possible that element 1502 will be the aero-mechanically active facing down platform that hold the device, and element 1503 will be a rigid and stable supporting element having a flat facing up surface.

It has to be emphasized, according to all apparatuses and apparatus configurations of the present invention, that the essential functionality of all apparatuses and apparatus configurations of the present invention is to provide controllable not-contact support to an object. It has to be emphasized also that the term controls means to adjust the fluid cushion gap by AM-means. It has to be emphasized also that AM-means (AM stand for aero-mechanic or fluid-mechanic) represent regulation of the pressure level at one or more of the manifolds of at least one sector of the non-contact platform that support the object. It may be done by controlling any pressure control valve of the apparatus, and additionally with any provided piston interposed with a manifold.

It has to be emphasized, according to the embodiments of the present invention, that the apparatuses with respect to the present invention has a non-contact platform, in most cases designed to be engaged with a hosting system. The platform has an active surface that may be divided to several individually controlled sectors are aimed to allow fluid cushion gap adjustment in a global and/or local manner for the following relative purposes (e.g., fluid-cushion gap adjustment options):

Adjusting the top surface or the bottom surface (e.g. that facing the active surface), of an object, or a section of it, to be at a desired distance (e g. the fluid cushion gap), from active surface of the supporting platform itself.

Adjusting the top surface of an object, or a section of it, to be at a desired distance from a reference point or a line of a process tool (for example an optical device), locates above the platform.

Adjusting the flatness of the top or the bottom surface of an object with respect to a perfectly flat reference plane virtually attached to the supporting platform.

Adjusting the top surface of an object to be parallel to substantially flat reference plane of a process tool above the platform (for examples, a cleaning head or a slit-coater dispenser or a laterally traveling optical device),.

Adjusting the top surface of an object to be parallel to substantially flat reference plane of a process tool above the platform.

Simultaneously applying (d) and (e).

It has to be emphasized, according to the embodiments of the present invention, that the apparatuses with respect to the present invention may have additional missions applied by the apparatus (e.g., in addition to fluid-cushion gap adjustment options). Without derogating the generality, some of the additional missions may be to assist a process. For example Apparatus with respect to the present invention may assist a process by adding heating or cooling elements.

Apparatus with respect to the present invention may assist a process by adding illumination source.

Apparatus with respect to the present invention may assist a process by adding sensors for controlling the process.

Apparatus with respect to the present invention may assist a process by adding illumination source.

Without derogating the generality, some of the additional missions can be even the essential missions of process tools. For example Apparatus with respect to the present invention may execute a thermal process.

Apparatus with respect to the present invention may execute a wet-clean or dry clean process (where chemical may involved), as well as drying the object It has to be emphasized, according to some embodiments of the invention, that in many cases the fluid-cushion will be an air-cushion. Although some embodiments of the invention may be described with reference to non-contact support platforms implementing air as a fluid, it will be appreciated by those skilled in the art that any other suitable gas, for example, $N_2$, Ar or $H_e$ may be implemented, as well as liquids like D.I. water as known in the art, or even chemicals.

It has to be emphasized, according to some embodiments of the invention, that the fluid cushion formed between the Object and the active surface of the platform may be dynamically isolated by AM-means, e.g., in order to isolate without contact the object (such as a wafer) front-side environment from the the fluid cushion environment during a process. This may be achieved, for example, by applying vacuum suction at the edge of the platform.

It has to be emphasized, according to some embodiments of the invention, that non-contact support platform may implement liquids, for example, D.I. water, to provide water-cushion to support an object, during a process preformed in a liquid environment, e.g., a process is being applied on the object when immersed in liquid.

Furthermore, it will be appreciated according to embodiments of the invention, that the apparatus may be used as part of a process machine operated (a) at atmospheric conditions (b) at significantly higher pressure conditions with respect to the atmospheric conditions (c) vacuum conditions, e.g., a vacuum level of about 10 millibars or more (absolute pressure).

It will be appreciated by those skilled in the art that local or global adjustment of the fluid cushion gap by AM-means may be performed without any control system, for example manual pre-calibration of a system or occasional calibration of a system during service operations. How ever in most cases control unit will be provided to allow local or global automatic controlling of the fluid-cushion gap by AM-means and in addition to control the motion system that moves the object or controlling missions associated with the process. Without derogating the generality some of the situations where automatically controlled process is applied are:

Automatically controls very accurately (e.g. in respect to specific process requirement), by using AM-means for adjusting globally or locally the fluid cushion gap, the distance and/or parallelism of a surface of an object or a section of it, with respect to a reference tool, as the object is supported by the non-contact platform and being in rest or being laterally moved laterally moved as motion is accurately controlled, for example, to establish an AM Auto-focus system for inspection systems or for photolithography systems.

Automatically controls very accurately (e.g. in respect to specific process requirement), by using AM-means for adjusting globally or locally the fluid cushion gap, the distance (e.g. the fluid-cushion gap) to the active surface of the platform itself or flatness of a surface of the object or a section of it, as the object is stably supported by the non-contact platform and being in rest or being laterally moved laterally moved as motion is accurately controlled, for example, gap control to provide uniform heating by the non-contact platform.

It will be appreciated by those skilled in the art that local or global adjustment of the fluid cushion gap by AM-means according to the present invention is aimed to provide high performance in the following aspects:

Highly accurate and sensitive fluid-cushion gap control for adjusting distances

Highly accurate and sensitive fluid-cushion gap-control for adjusting parallelism or the flatness of a surface of an object Improved dynamic performance by significantly enhanced time-response due to the fact that only the mass of the object, and in addition, preferably light handling elements are applied.

Highly accurate positioning (e.g. lateral positioning of the object).

In order not do derogate the generality, it will be appreciated by those skilled in the art that the use of a non-contact support platform with respect to the present invention is aimed for handling of any relevant object. However, in particular most of the apparatuses with respect to the present intentioned aimed to support or to clamp without contact thin, relatively wide, and substantially flat objects, such as SC wafers or FPD substrates, objects that are flexible to some extent.

It will be appreciated by those skilled in the art that the use of a non-contact support platform may prevent damage, which may occur if the supported surface of the wafer is in contact with the supporting platform, for example, preventing any mechanical damage such as scratches, or any slippage related damages, as well as significantly reducing backside particles contamination and ESD related damages.

Although some embodiments of the invention described above refer to an inspection or a photolithography process, e.g., mainly optical oriented processes, it will be appreciated by those skilled in the art that the apparatus of the present invention may be implemented by other processes, e.g., SC or FPD processes, for example, a coating process, a thermal process, or any other process not related to the SC or FPD industries, for example, MEMS, optics, and/or glass processes. However, the apparatus of the present invention may be implemented to other processes such as printing and press machine, for accurately support optical device or for accurate handling any metallic or non metallic materials that are definitely not included at the "territory" of SC and FPD industries.

The invention claimed is:

1. A method for focusing an optical inspection device on a facing surface of a substantially flat object, the method comprising:

supporting the substantially flat object over a platform having a plurality of pressure outlets and a plurality of fluid-evacuation channels, wherein the pressure outlets are connected each through a pressure flow restrictor to a high-pressure manifold which is connected through a main supply pipeline to a pressurized fluid supply, wherein the plurality of fluid-evacuation channels are connected to a low-pressure manifold which is connected through a main evacuation pipeline to a low pressure source, and wherein at least one pressure control valve is provided to regulate the pressure level of at least one of the manifolds;

changing the volume of at least one manifold; and regulating the pressure level of at least one of the manifolds to adjust a gap between the platform and the object so as to focus the optical inspection device on the facing surface of the object.

* * * * *